US007246796B2

(12) United States Patent
Toda et al.

(10) Patent No.: US 7,246,796 B2
(45) Date of Patent: Jul. 24, 2007

(54) CARBURETOR, VARIOUS TYPES OF DEVICES USING THE CARBURETOR, AND METHOD OF VAPORIZATION

(75) Inventors: Masayuki Toda, 7-139, Higashi 2-chome, Yonezawa-shi, Yamagata 992-0026 (JP); Masaki Kusuhara, Tokyo-to (JP); Masaru Umeda, Tokyo-to (JP); Mitsuru Fukagawa, Tokyo-to (JP)

(73) Assignees: Masayuki Toda, Yamagata (JP); Kabushiki Kaisha Watanabe Shoko, Tokyo (JP)

( * ) Notice: Subject to any disclaimer, the term of this patent is extended or adjusted under 35 U.S.C. 154(b) by 0 days.

(21) Appl. No.: 10/466,528

(22) PCT Filed: Jan. 18, 2002

(86) PCT No.: PCT/JP02/00330

§ 371 (c)(1),
(2), (4) Date: Dec. 8, 2003

(87) PCT Pub. No.: WO02/058141

PCT Pub. Date: Jul. 25, 2002

(65) Prior Publication Data

US 2004/0113289 A1      Jun. 17, 2004

(30) Foreign Application Priority Data

Jan. 18, 2001   (JP)   ............................. 2001-010827
Nov. 18, 2001   (JP)   ............................. 2001-392833

(51) Int. Cl.
*B01F 3/04* (2006.01)

(52) U.S. Cl. ............ 261/127; 261/140.1; 261/DIG. 65; 118/726; 392/397

(58) Field of Classification Search ................ 261/127, 261/140.1, 152, DIG. 65; 118/726; 392/396, 392/397, 399
See application file for complete search history.

(56) References Cited

U.S. PATENT DOCUMENTS 4,847,469 A * 7/1989 Hofmann et al. ............ 392/397

(Continued)

FOREIGN PATENT DOCUMENTS

JP       58/180017       10/1983

(Continued)

OTHER PUBLICATIONS

Translation of the International Preliminary Examination Report.

*Primary Examiner*—Scott Bushey
(74) *Attorney, Agent, or Firm*—Young & Thompson

(57) ABSTRACT

A vaporizer which can be used for extended time without blockage, and possible to stably supply raw materials to a reaction part. A gas passage 2 is formed inside of main body of a dispersion part 1, a gas inlet opening 4 is utilized to introduce a pressurized carrier gas 3 into gas passage 2, a supply source 6 is utilized to supply raw material solution 5 to a carrier gas passing through gas passage 2. A vaporization pipe 20 is connected with a reaction part and gas outlet 7 of dispersion part 8 of the device, with a heater 21 to heat vaporization pipe 20, while a vaporization part 22 is utilized to heat and vaporize the carrier gas where a raw material solution is dispersed.

6 Claims, 23 Drawing Sheets

U.S. PATENT DOCUMENTS

| | | | |
|---|---|---|---|
| 5,882,416 A * | 3/1999 | Van Buskirk et al. | 118/726 |
| 6,036,783 A * | 3/2000 | Fukunaga et al. | 118/724 |
| 6,039,074 A * | 3/2000 | Raaijmakers et al. | 137/537 |
| 6,062,499 A * | 5/2000 | Nakamura et al. | 239/585.1 |
| 6,210,485 B1 * | 4/2001 | Zhao et al. | 118/724 |
| 6,269,221 B1 * | 7/2001 | Horie et al. | 392/399 |
| 6,277,201 B1 * | 8/2001 | Nishikawa | 118/726 |
| 6,296,711 B1 * | 10/2001 | Loan et al. | 118/726 |
| 6,409,837 B1 * | 6/2002 | Hillman | 118/712 |
| 6,470,144 B1 * | 10/2002 | Tarutani et al. | 392/396 |
| 6,540,840 B1 * | 4/2003 | Toda et al. | 118/726 |
| 6,773,687 B1 * | 8/2004 | Hasegawa | 423/210 |
| 2003/0021595 A1 * | 1/2003 | Xu et al. | 392/400 |

FOREIGN PATENT DOCUMENTS

| | | |
|---|---|---|
| JP | 07/054151 | 2/1995 |
| JP | 2000/216150 | 8/2000 |
| WO | WO 99/02756 | 1/1999 |

* cited by examiner

Fig. 11

CARBURETOR, VARIOUS TYPES OF DEVICES USING THE CARBURETOR, AND METHOD OF VAPORIZATION

BACKGROUND OF THE INVENTION

1. Technical Field

The present invention relates to a vaporizer and a vaporizing method, which is preferably used for a deposition device such as a MOCVD, as well as other various devices.

2. Background Art

The development of DRAM causes a problem concerning memory capacitance depending on microfabrication. Some measures for the problem about the memory capacitance is necessary because the degree of performance of the capacitance is required to be the same as the former generation in view of potential software errors. As the measure for the above-described problem, a capacitor area has been increased as follows. A planar structure has been taken as the cell structure up to 1M capacity. However, the three-dimensional structure, called a stack structure or a trench structure, has been taken as the cell structure for 4M or above. Moreover, as a dielectric film, a film which laminates an oxidation film from the heat oxidation film of a Si substrate and a CVD nitride film (the laminated film is called an ON film in general) on poly Si is adopted. The film types utilizing the back side of a plate, a cubic type using the side in stack type, were taken in order to increase area to contribute to capacity 16M DRAM.

However, deterioration of yield by an increase of process number by a complicated process and increase of difference in steps is brought into question by such a three-dimensional structure, and it is assumed that realization after the 256 M bit limit is difficult. Therefore, as one way to further increase a degree of integration without changing the structure of the present DRAM, a method to shift a dielectric for a capacitance to the one having a higher dielectric constant is devised. Thus, at first, thin films of paraelectric oxides of single metals with high dielectric constant, such as $Ta_2O_5$, $Y_2O_3$, and $HfO_2$, attract attention. As for each ratio dielectric constant, $Ta_2O_5$ is 28, $Y_2O_3$ is 16, $HfO_2$ is around 24, and is 4 to 7 times of $SiO_2$.

However, in an application after 256M DRAM, a three-dimensional capacitor structure is required. $(Ba_xSr_{1-x})TiO_3$, $Pb(Zr_yTi_{1-y})O_3$, $(Pb_aL_{1-a})(Zr_bTi_{1-b})O_3$ are regarded as promising materials which have the higher relative dielectric constant than the above-described oxides and can be expected to apply to the DRAM.

Moreover, recently, a layered structure of Bi group which has a very similar crystal structure to the one of a superconductive material greatly attracts the attention because it has a high dielectric constant, has a self polarization characteristic of a ferroelectric, and is superior as a nonvolatile memory. Generally, the thin film formation of $SrBi_2TaO_9$ ferroelectric is done by MOCVD (metalorganic chemical vapor deposition) method—the practical and promising method. The raw material of the ferroelectric thin film includes, for instance, three kinds of organometallic complex, $Sr(DPM)_2$, $Bi(C_6H_5)_3$, and $Ta(OC_2H_5)_5$, melt respectively in THF (Tetorahidorofran), hexane, and other solvents, and this combination is used as a raw material solution. $Sr(Ta(OEt)_6)_2$ and $Bi(OtAm)_3$ can be melted in hexane and other solvents and used as a raw material solution. Note that DPM is an abbreviation of bis(diphenylphosphino)methane.

Table 1 shows each material characteristic.

TABLE 1

Characteristics of a raw material for a ferroelectric thin film

| | Boiling point (° C.) and pressure (mm Hg) | Melting point (° C.) |
|---|---|---|
| $Sr(DPM)2$ | 231/0.1 | 210 |
| $Bi(C_6H_5)_3$ | 130/0.1 | 80 |
| $Ta(OC_2H_5)_5$ | 118/0.1 | 22 |
| THF | 67 | −109 |
| $Sr(Ta(OEt)_6)_2$ | 176/0.1 | 130 |
| $Bi(OtAm)_3$ | 87/0.1 | 90 |

A device to be used for the MOCVD method includes a reaction part in which the $SrBi_2TaO_9$ thin film material is deposited after a phase reaction and a surface reaction and further includes a supply part which supplies the $SrBi_2TaO_9$ thin film material and an oxidizer to the reaction part. Moreover, the supply part is provided with a vaporizer for vaporizing the thin film material.

Respective methods shown in FIG. 16 are known, so far, as a technology concerning the vaporizer. The one shown in FIG. 16(a) is called a metal filter type, and it is a method that introduces and vaporizes the raw material solution heated to a prescribed temperature into a metal filter used to increase the contact area between an atmospheric gas and the raw material solution of the $SrBi_2TaO_9$ ferroelectric thin film.

However, in this technology, the metal filter can become clogged by the effect of several hours of vaporization. As such, there is a problem that it cannot bear the long-term use. The present inventor guessed that it is because the solution is heated and vaporized from a solution having a low vaporization temperature.

FIG. 16(b) shows a technology that the raw material solution is discharged from a small hole of 10 µm by applying the pressure of 30 kgf/cm² to it and vaporized by the expansion.

However, the problem of clogging the small hole by the use for several hours, and not enduring a long-term use is also observed in this technology.

Moreover, the problem that a steady raw material supply cannot be achieved to a reaction is created because the solvent with the highest vapor pressure (in the following case, THF) evaporates promptly and an organometallic complex deposits and adheres on the heating face, when the raw material solution is a mixture solution of organometallic complexes, for instance, $Sr(DPM)_2$/THF, $Bi(C_6H_5)_3$/THF and $Ta(OC_2H_5)_5$/THF, and this mixture solution is evaporated by heating. As for all these methods shown in FIG. 1, the energy (e.g., the number of calories) which could vaporize or alter the solvent in the liquid or mist state turns up to be added.

In addition, in MOCVD, to obtain an excellent film uniformity, a vaporization gas in which the raw material solution is dispersed uniformly is required to be obtained. However, in the prior art, such a requisite is not necessarily complied with.

SUMMARY OF THE INVENTION

The present inventor offers, separately, the next technology so that the requisite may be complied with.

That is, as shown in FIG. 15, a vaporizer for MOCVD, comprises:

① a dispersion part including a gas passage formed internally, a gas inlet to introduce a pressurized carrier gas into the gas passage, a means to supply the raw material solution to the gas passage, a gas outlet to send the carrier gas including the raw material solution to the vaporization part, a means to cool the gas passage, and a radiant heat prevention jet part cooled so that thermal energy should not be applied to the raw material gas in the dispersion part by the radiant heat from the vaporization part; and ② a vaporization part for heating the carrier gas including the raw material solution and vaporizing the raw material solution, sent from the dispersion part, the vaporization part comprising a vaporization tube whose one end is connected to a reaction tube of the MOCVD device and whose other end is connected to said gas outlet, and a heating means to heat the vaporization tube.

Thereby, the vaporizer is composed in such a manner that thermal energy should not be applied to the raw material gas in the dispersion part by the radiant heat from the vaporization part.

Since the vaporizer for MOCVD of this technology clogs a little, it enables a long term use and a stable supply of material to the reaction part, compared with the prior art.

Moreover, as for this technology, an inlet of the preheated oxygen has been installed downstream of the vaporization part.

However, even by using this technology, the deposition of the crystalline material might still be observed in the gas passage to cause clogging.

Moreover, a large amount of carbon (30 to 40 at %) is included in the formed film. It is necessary to anneal at the high temperature after film deposition (example: oxygen atmosphere of 800° C. for 60 minutes) in order to remove this carbon.

In addition, when deposition is to be done, a large difference of composition ratio can be caused.

Another object of the present invention is to provide a vaporizer that can be used for a long term without clogging or the like and that can supply stably a raw material to a reaction part.

Another object of the present invention is to provide a vaporizer, a deposition device, other various devices, and a vaporization method that can extremely reduce the content of carbon in the film, even in the as-deposited state, and accurately control the composition ratio of the film.

Another object of the present invention is to provide a vaporizer and a vaporization method by which a vaporization gas with uniformly dispersed raw material solution can be obtained.

A vaporizer of the present invention comprises:

① a dispersion part including:
a gas passage formed internally,
a gas inlet to introduce a carrier gas into the gas passage,
a means to supply a raw material solution to the gas passage,
a gas outlet to send the carrier gas including the raw material solution to a vaporization part, and
a means to cool the gas passage, and ② a vaporization part for heating the carrier gas including the atomized raw material solution and for vaporizing the atomized raw material solution, sent from the dispersion part, the vaporization part comprising:
a vaporization tube whose one end is connected to a reaction part of various units such as deposition unit, and whose other end is connected to said gas outlet, and
a heating means to heat the vaporization tube; and
a radiation prevention part having a small hole outside the gas outlet.

A vaporizer of the present invention comprises:

① a dispersion part including:
a gas passage formed internally,
a gas inlet to introduce a pressurized carrier gas into the gas passage,
a means to supply the raw material solution to the gas passage, and
a gas outlet to send the carrier gas including the raw material solution to the vaporization part, and ② a vaporization part for heating the carrier gas including the raw material solution and vaporizing the raw material solution, sent from the dispersion part, the vaporization part comprising:
a vaporization tube whose one end is connected to a reaction part of various units such as a deposition unit, and whose other end is connected to the gas outlet, and
a heating means to heat the vaporization tube; wherein ③ the dispersion part comprises
a dispersion main body having a cylindrical or conical hollow part, and
a rod having an outer diameter smaller than the inner diameter of the cylindrical or conical hollow part, in which
the rod has one or more spiral groove(s) on the vaporizer side of the outer periphery thereof, the rod being inserted in the hollow part, and ④ a radiation prevention part having a small hole on the gas outlet side and the inner diameter expanding towards the vaporizer side and cooled, the radiation prevention part being installed outside the gas outlet.

A vaporizer of the present invention comprises:

① a dispersion part including:
a gas passage formed internally,
a gas inlet to introduce a carrier gas into the gas passage,
a means to supply a raw material solution to the gas passage,
a gas outlet to send the carrier gas including the raw material solution to a vaporization part, and
a means to cool the gas passage, and ② a vaporization part for heating the carrier gas including the raw material solution and vaporizing the raw material solution, sent from the dispersion part, the vaporization part including;
a vaporization tube whose one end is connected to a reaction part of various units such as a deposition unit, and whose other end is connected to the gas outlet, and
a heating means to heat the vaporization tube, wherein
a method which adds and introduces a little bit of the oxidation gas as a carrier gas to Ar, N2, helium or the like from the gas inlet or which can introduce the oxidation gas or its gas mixture from a supply part of the first oxygen in the vicinity of the jet part.

A vaporizer of the present invention comprises:

① a dispersion part including:
a gas passage formed internally,
a gas inlet to introduce a carrier gas into the gas passage,
a means to supply the raw material solution to the gas passage,
a gas outlet to send the carrier gas including the raw material solution to the vaporization part, and
a means to cool the gas passage, and ② a vaporization part for heating the carrier gas including the raw material solution and vaporizing the raw material solution, sent from the dispersion part, the vaporization part including:

a vaporization tube whose one end is connected to a reaction part of various units such as a deposition unit, and whose other end is connected to the gas outlet, and a heating means to heat the vaporization tube, wherein a radiation prevention part having a small hole is installed outside the gas outlet, and the carrier gas and an oxidizing gas can be introduced from the gas inlet.

A vaporizing method of the present invention is characterized in that oxygen is contained in the carrier gas in the vaporizing method in which a raw material solution is introduced into a gas passage, next a raw material gas is obtained by shearing and atomizing the raw material solution after jetting the high-speed carrier gas to the introduced raw material solution, and then, the raw material gas is supplied to a vaporizing part and vaporized.

A vaporizer of the present invention comprises:

a plurality of passages for supplying raw material solution, a mixture part for mixing a plurality of raw material solutions supplied from a plurality of solution passages, a supply passage of which one end communicates with the mixture part and of which the other end is an outlet of the vaporization part side, a gas passage arranged to spray the carrier gas or the mixed gas of the carrier gas and oxygen to the mixture raw material solution carried from the mixture part in the supply passage, and a cooling means to cool the supply passage.

A disperser of the present invention comprises:

a disperser unit, having:

a plurality of solution passages for supplying raw material solution, a mixture part for mixing a plurality of raw material solutions supplied from a plurality of solution passages, a supply passage of which one end communicates with the mixture part and the other end of which has an outlet of the vaporization part side, a gas passage arranged to spray a carrier gas or a mixed gas of the carrier gas and oxygen to the mixture raw material solution from the mixture part, in the supply passage, and a cooling means to cool the supply passage; and a vaporizer, having:

a radiation prevention part having a small hole outside the gas outlet;

a vaporization part for heating the carrier gas including the raw material solution and vaporizing the raw material solution, sent from the disperser unit, a vaporization tube whose one end is connected to a reaction part of various units such as a deposition unit and whose other end is connected to the outlet of the disperser; and a heating means to heat the vaporization tube.

BRIEF DESCRIPTION OF DRAWINGS

The above-mentioned and other features and advantages of this invention, and the manner of attaining them, will become more apparent and the invention will be better understood by reference to the following description of an embodiment of the invention taken in conjunction with the accompanying drawings, wherein:

FIG. 11 is a graph where the experimental results for embodiment 6 are shown;

Corresponding reference characters indicate corresponding parts throughout the several views. The exemplification set out herein illustrates one preferred embodiment of the invention, in one form, and such exemplification is not to be construed as limiting the scope of the invention in any manner.

SYMBOLS

Figure 1:
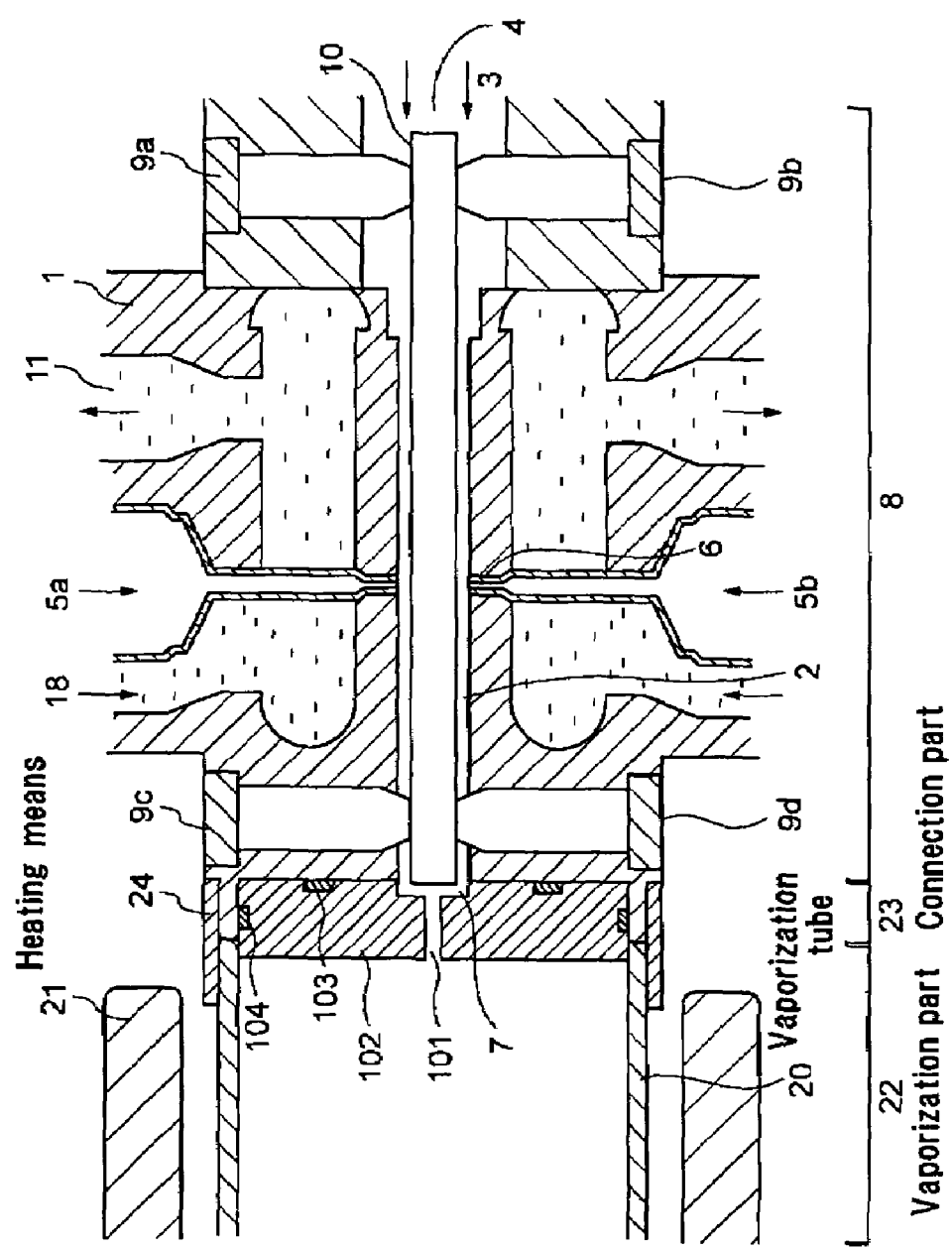
FIG. 1 is a cross-sectional view showing essential parts of a vaporizer for MOCVD according to an embodiment 1.

1 Main body of a dispersion part,
2 Gas passage,
3 Carrier gas,
4 Gas inlet,
5 Raw material solution,
6 Raw material supply hole,
7 Gas outlet,
8 Dispersion part,
9a, 9b, 9c, 9d: Bis,
10: Rod,
18: Means to cool (cooling water),
20: Vaporizing tube,
21: Heating means (heater),
22: Vaporizing part,
23: Connection part,
24: Coupling,
25 Oxygen introduction means (first oxygen (oxidation gas) supply opening), 29 Raw material supply inlet,
30a, 30b, 30c, 30d Mass flow controller,
31a, 31b, 31c, 31d Valve,
32a, 32b, 32c, 32d Reservation tank,
33 Carrier gas bomb,
42 Exhaust port,
40 Valve,
44 Reaction pipe,
46 Gas pack,
51 Taper,
70 Groove,
101 Small hole,
102 Radiation prevention portion,
200 Oxygen introduction means (second oxygen (oxidation gas))
carrier supply opening,)
301 Upstream ring
302 Downstream ring
303a, 303b Heat transmission passage
304 Heat conversion board
304a Gas vent gas nozzle
306 Exhaust port
308 Orifice
312 Substrate heater
320 Heat medium inlet
321 Heat medium outlet
390 Heat introduction medium
391 Heat outlet medium
3100 Silicon substrate

DETAILED DESCRIPTION OF THE INVENTION

Embodiment 1

FIG. 1 shows a vaporizer for MOCVD according to an embodiment 1.

This embodiment includes a dispersion part 8 including a gas passage 2 formed in the interior of a dispersion main body 1 constituting the dispersion part, a gas inlet 4 to introduce a pressurized carrier gas 3 into the gas passage 2, a means (a raw material supply hole) 6 to supply a raw material solution 5 to the carrier gas 3 passing through the gas passage 2 and atomize the raw material solution 5, a gas outlet 7 to send the carrier gas (raw material gas) including the atomized raw material solution 5 to a vaporization part 22, and a means (cooling water) 18 to cool the carrier gas flowing in the gas passage 2. The embodiment further includes the vaporization part 22 for heating the carrier gas and the raw material solution to be dispersed and vaporizing the raw material solution, sent from the dispersion part 8, the vaporization part including a vaporization tube 20 whose one end is connected to a reaction pipe of the MOCVD device and whose other end is connected to the gas outlet 7 of the dispersion part 8, and a heating means (heater) 21 to heat the vaporization tube 20, wherein a radiation prevention part 102 having a small hole 101 is provided outside the gas outlet 7.

The embodiment is explained more in detail as follows.

In the embodiments shown in figures, the inside of main body 1 of a dispersion part 8 is a hollow cylindrical part. A rod 10 is fit in the hollow part, and a gas passage 2 is defined by an inner wall of the main body 1 and rod 10. In addition, the hollow part is not limited to a cylindrical shape, as other shapes may be applied. A conical shape, for example, may be preferable. As an angle of a round nest of a hollow part in the conical shape, it is preferable to be 0 to 45 degrees, and more preferably, to be 8 to 20 degrees. It is similar in other embodiments.

The cross sectional area of the gas passage is preferably from 0.10 to 0.5 mm$^2$.

The processing is difficult if less than 0.10 mm$^2$. The necessity for a large quantity of flow in carrier gas of the high pressure turns up to be caused to speed up the carrier gas when exceeding 0.5 mm$^2$. A large-scale vacuum pump of large capacity is needed to maintain a reaction chamber under decompression (example: 1.0 Torr) when the carrier gas of a large quantity of flow is used. A proper quantity of flow, that is, the gas passage area of 0.10 to 0.5 mm$^2$, is preferable to achieve an industrial practical use because it is difficult to adopt a vacuum pump that exceeds 10,000 liter/min (at 1.0 Torr) in exhaust capacity.

The gas inlet 4 is installed in one end of the gas passage 2. A carrier gas (for instance, $N_2$, Ar, and He) source (not shown) is connected to the gas inlet 4.

The raw material supply hole 6 is installed on the side approximately at the middle of the dispersion main body 1 in communication with the gas passage 2, allowing to introduce the raw material solution 5 into the gas passage 2 and dispersing the raw material solution 5 to the carrier gas that passes through the gas passage 2 to make it the raw material gas.

The gas outlet 7 that leads to the vaporization tube 20 in the vaporization part 22 is installed in one end of the gas passage 2.

A space 11 to flow the cooling water 18 is formed in the dispersion main body 1, and the carrier gas which flows in the gas passage 2 is cooled by flowing the cooling water 8 in this space. Alternatively, it may be cooled by setting up a Peltier element or the like, for instance, instead of this space. Only the solvent vaporizes in the gas passage 2, without causing the vaporization simultaneously of the solvent of the raw material solution and an organometallic complex in the gas passage 2 that is subjected to the heat influence by the heater 21 of the vaporization part 22. There, the solvent is prevented from being vaporized solely by cooling the carrier gas, in which the raw material solution is dispersed, flowing in the gas passage 2. Especially, cooling of the downstream side of the raw material supply hole 6 is important, and at least the downstream side of the raw material supply hole 6 is cooled. The cooling temperature is a temperature below the boiling point of the solvent. For instance, it is 67° C. or less for THF. Especially, the temperature in the gas outlet 7 is important.

In this embodiment, in addition, the radiation prevention part 102 that has a small hole 101 outside the gas outlet 7 is installed. The numeral 103,104 represent seal materials such as an O ring. This radiation prevention part 102 may be composed, for instance, of TEFLON (DuPont Corporation's tradename for their solid, chemically inert polymer of tetrafluoroethylene), stainless steel, ceramic, etc. In addition, it is preferable to make of a material excellent in heat conduction. According to the finding of the present inventor, the gas in gas passage 2 is overheated, in the prior art, by the heat in the vaporization part, as the radiant heat through the gas outlet 7. Therefore, the low melting point elements in the gas deposit in the vicinity of the gas outlet 7 even if it is cooled with cooling water 18.

The radiation prevention part 102 is a member to prevent this radiant heat from spreading to the gas. Therefore, it is preferable to reduce the cross sectional area of the small hole 101 to less than that of gas passage 2. A reduction of ½ or less is preferable and ⅓ or less is more preferable. In addition, it is preferable to miniaturize the small hole 101. In particular it is preferable to miniaturize it to a dimension where gas jets out at a subsonic velocity. Moreover, it is preferable that the length of the small hole 101 is 5 times or more than the dimension of the small hole 101, and more preferably, the length is 10 times or more than the small hole's dimension.

Moreover, blockage in the gas passage 2 (especially, gas outlet) with a carbide is never caused even for the long term use, by cooling the dispersion part 8.

The dispersion main body 1 is connected to the vaporization tube 20 on the downstream side of the dispersion main body 1. The connection between the dispersion main body 1 and the vaporization tube 20 is done with a joint 24, and this part is a connection part 23.

Figure 2:
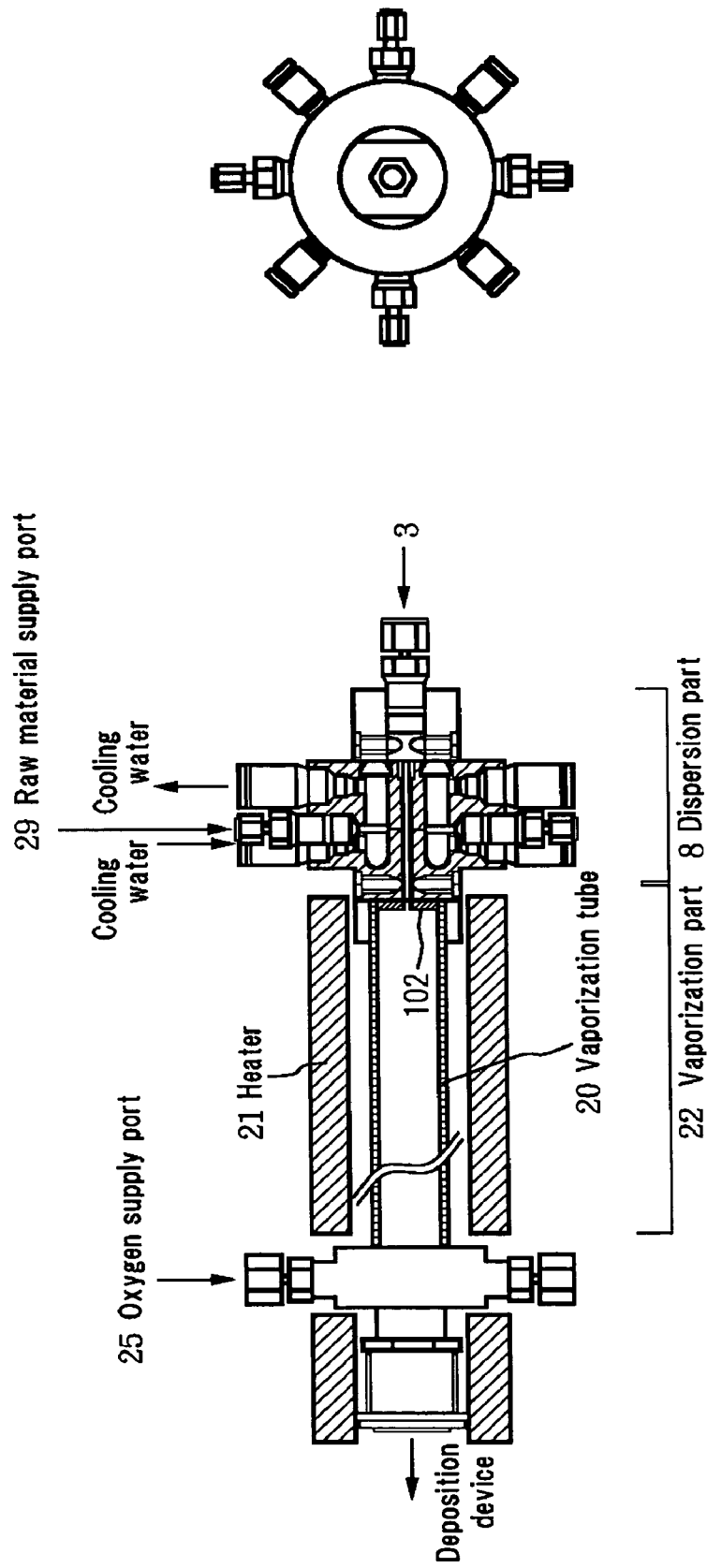
FIG. 2 is a global cross-sectional view of the vaporizer for MOCVD according to the embodiment 1.

FIG. 2 shows the general view. The vaporization part 22 is composed of the vaporization tube 20 and the heating means 21 (i.e., a heater). The heater 21 is a heater to heat the carrier gas in which the raw material solution is dispersed that flows in the vaporization tube 20 and to thereby vaporize the raw material solution. In the prior art, the heater 21 has been composed of a cylindrical heater or a mantle heater mounted on the outer periphery of the vaporization tube 20. This was adopted because the method of using a liquid or gas with a large thermal capacity as the heat medium has been the most excellent for heating in a manner so as to obtain an uniform temperature in the longitudinal direction of the vaporization tube.

It is preferable to use stainless steels such as SUS316L, for instance, as the material for the vaporization tube 20. The size of the vaporization tube 20 may be decided conveniently so to extend only to such a length that the temperature of the vaporization gas is heated sufficiently. For instance, when $SrBi_2Ta_2O_9$ raw material solution 0.04 ccm is vaporized, the chosen tube 20 may be ¾ inches in outer diameter and several hundred mm in length.

Though the downstream side edge of the vaporization tube 20 is connected to a reaction tube of the MOCVD device, in this embodiment an oxygen supply port 25 is installed in the vaporization tube 20 as an oxygen supply means, allowing to mix the oxygen heated to a prescribed temperature into the carrier gas.

Figure 3:
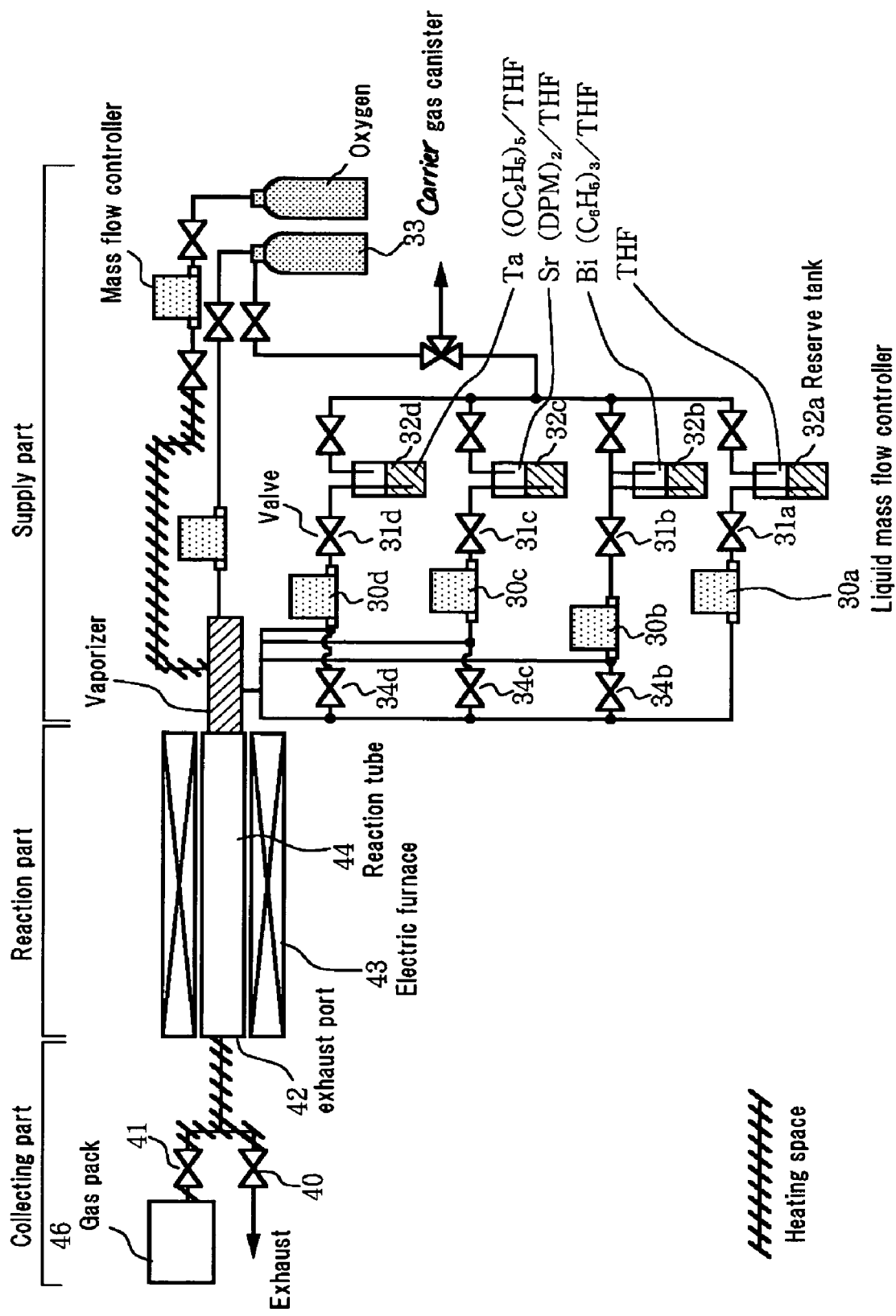
FIG. 3 is a system chart of MOCVD.

Supplying the raw material solution to the vaporizer shall now be described. Reserve tanks 32a, 32b, 32c, and 32d are connected to the raw material supply port 6, respectively, through mass flow controllers 30a, 30b, 30c, and 30d, and valves 31a, 31b, 31c, and 31d as shown in FIG. 3. Moreover, each of reserve tanks 32a, 32b, 32c, and 32d is connected to a carrier gas canister 33.

Figure 4:
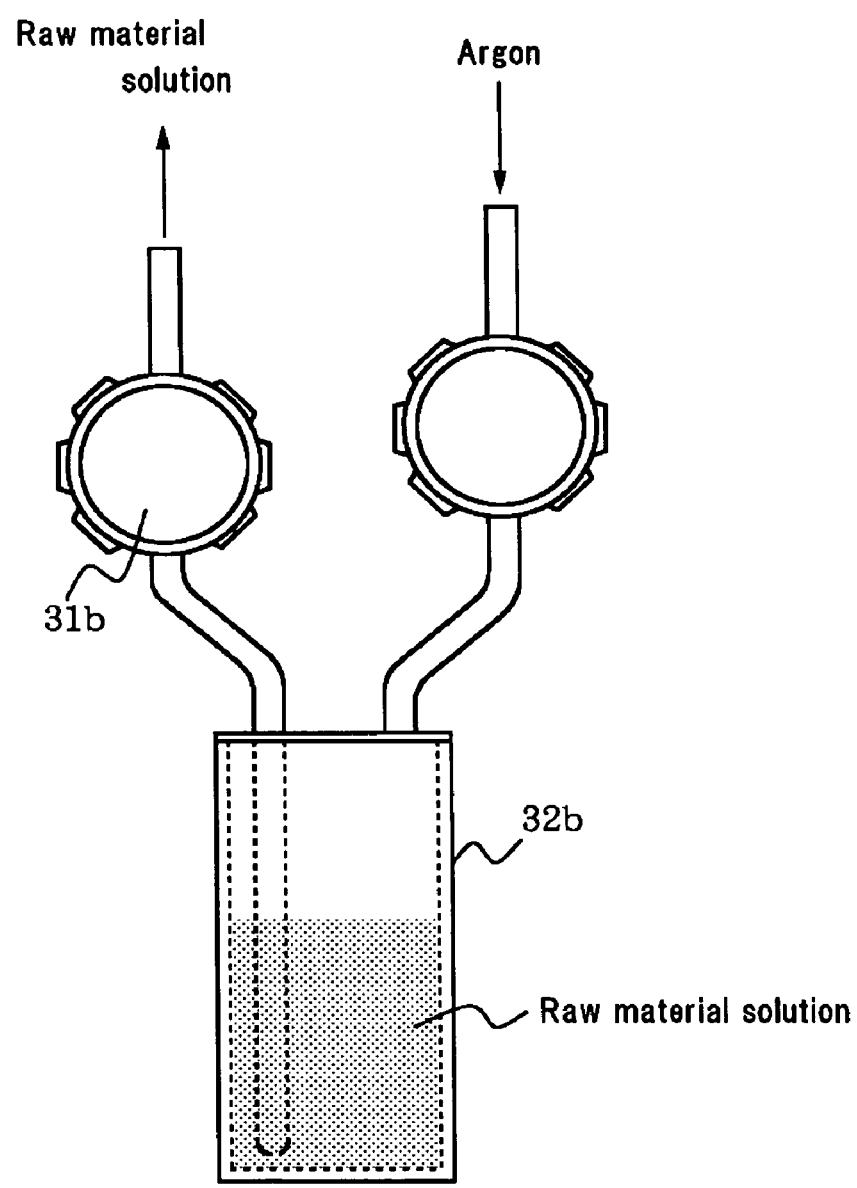
FIG. 4 is a front view of a reserve tank.

FIG. 4 shows the details of the reserve tank. The reserve tank is filled with the raw material solution 5 and, for instance, 1.0 to 3.0 $kgf/cm^2$ of the carrier gas 3 (for instance, inert gas Ar, He, Ne) is sent to the respective reservoir tank 32a–32d (an inner capacity 300 cc, made by SUS). The raw material solution is pushed up in the tube on the side contacting with the solution, because the interior of the reservoir tank is pressurized by the carrier gas, and transferred under pressure to a mass flow controller (made by STEC, full-scale flow 0.2 cc/min). A flowing quantity is controlled here, and it is transported from a raw material supply port 29 of the vaporizer to the raw material supply hole 6.

The following quantity of combined carrier gas and raw material solution is transported to a reaction part by carrier gas and controlled to a constant flowing quantity in the appropriate mass flow controller. At the same time, oxygen (oxidant) which is controlled to a fixed flowing quantity in a mass flow controller (made by STEC, full-scale flow 2 L/min) is also transported to the reaction part.

The raw material solution 5 deposits an organometallic complex by the vaporization of THF solvent and becomes finally solid when left as it is, because a liquid or a solid organometallic complex has been dissolved in solvent such as THF, at the normal temperature. Therefore, it is assumed, as a result, that the interior of a piping or other piping portions that comes in contact with such a stock solution can become blocked by these deposits. Therefore, it is thought that the interior of the piping and the interior of the vaporizer need only be washed with THF or other solvents after the deposition work has ended to control the blockage of the piping, thus necessitating the installation of a washing line to facilitate such washing. Washing is exerted over a part from the container outlet side to the vaporizer, including the raw material container exchange work, and flushes the part which suits each work with the solvent.

Valves 31b, 31c, and 31d were opened, and the carrier gas was fed forcefully into the reserve tanks 32b, 32c, and 32d. As for the raw material solution, it is fed forcefully to the mass flow controller (made by STEC full-scale flowing quantity 0.2 cc/min), a flowing quantity is controlled here, and the solution raw material is transported to the raw material supply hole 6 of the vaporizer.

On the other hand, the carrier gas was introduced from the gas inlet of the vaporizer. It is preferable to set the maximum pressure on the supply port side to 3 $kgf/cm^2$ or less, and the maximum flowing quantity which can be passed at this time is about 1200 cc/min, and the passage flow velocity of the gas passage 2 reaches 110 m/sec.

When the raw material solutions is introduced from the raw material supply hole 6 into the carrier gas 3 flowing in the gas passage 2 of the vaporizer, the raw material solution is shorn by a high speed flow of the carrier gas and is atomized into ultrafine particles. As a result, the raw material solution is dispersed in the carrier gas in the state of ultrafine particles. The carrier gas (raw material gas) in which the raw material solution is dispersed in the state of ultrafine particle is atomized, keeping the high-speed, into the vaporization part 22 and discharged. An angle which the gas passage and the raw material supply hole form is optimized. When a carrier passage and a raw material solution inlet form an acute angle (30 degrees), the solution is attracted by the gas. If it is 90 degrees or more, the solution is pushed by the gas. The best angle is decided, from the viscosity and the flowing quantity of the solution. The solution flows smoothly by making it more acute when the viscosity and the flowing quantity are large. When the SBT film is formed by using hexane for the solvent, an angle of about 84 degrees is preferable because both the viscosity and the flowing quantity are small.

Three kinds of raw material solutions 5 controlled to a constant flowing quantity flow into the gas passage 2 from the raw material supply hole 6 through each raw material supply port 29, move in the gas passage with the carrier gas 3 which has become a high-speed current of air, before being discharged into the vaporization part 22. For the dispersion part 8 also, as the raw material solution is heated by heat from the vaporization part 22 and the vaporization of the solvent such as THF is promoted, the part from the raw material supply port 29 to the raw material supply hole 6 and the part of gas passage 2 are cooled with a cooling medium such as water.

The raw material solution 5 dispersed in a fine particle state in the carrier gas discharged from dispersion part 8 becomes a mixture gas by mixing the oxygen heated at a prescribed temperature from the oxygen supply port 25 installed immediately before reaching a reaction tube of MOCVD, the vaporization being promoted while the raw material solution being transporting inside the vaporization tube 20 is heated by a heater 21 to a prescribed temperature and flows in a reaction tube 44. In this embodiment, it is evaluated by analyzing the reactive mode of the vaporization gas in place of deposition.

A vacuum pump (not shown) was connected from an exhaust port 42, impurities such as moisture in a reaction tube 44 were removed by the decompression operation for about 20 minutes, and a valve 40 downstream of the exhaust port 42 was shut. The cooling water was flowed into the vaporizer at about 400 cc/min. On the other hand, the carrier gas of 3 kgf/cm$^2$ was flowed at 495 cc/min, the interior of the reaction tube 44 was filled enough with the carrier gas, and thereafter, the valve 40 was opened. The temperature at the gas outlet 7 was lower than 67° C.

The inside of the vaporization tube 20 was heated to 200° C., the part from the reaction tube 44 to a gas pack 46 and the gas pack to 100° C., and the inside of the reaction tube 44 heated in the range of from 300 to 600° C. The reserve tank was pressurized with the carrier gas therein, and a prescribed liquid was flowed by the mass flow controller. Sr(DPM)2, Bi(C$_6$H$_5$)$_3$, Ta(OC$_2$H$_5$)$_5$, and THF were flowed respectively by the flowing quantity of 0.04 cc/min, 0.08 cc/min, 0.08 cc/min, and 0.2 cc/min.

Twenty minutes later, the valve just before the gas pack 46 was opened, the reaction product was collected in the gas pack 46, and it was examined whether the detected product and the product in the reaction formula that had been examined based on the reaction theory agreed, through analysis by a gas chromatograph. The detected product and the product in the reaction expression that had been examined based on the reaction theory were found to agree well in this example. Moreover, the amount of adhesion of the carbide on the outer surface of the gas outlet 7 side was measured. The amount of adhesion of the carbide was determined to be very low and was still less than the case with a device shown in FIG. 14.

It is generally accepted that the raw material solution 5 becomes a liquid/liquid state (complete solvent liquid) with metals becoming complex, in the case of a mixture or dissolution of metals into the solvent to obtain a raw material solution. However, the present inventor elaborately examined the raw material solution and found that the metal complex does not necessarily come to a separate molecular state but, in some cases, the metal complex might exist in the solvent as particle of the size of 1 to 100 nm, and in some cases, the metal complex might exist partially as a solid/liquid state. It is thought that clogging during vaporization is especially easily caused when the raw material solution is in such a state. However, the clogging is not caused even for a raw material solution in such a state, in the case of using a vaporizer of the present invention.

Moreover, the fine particle material subsides easily by gravity to the bottom in a solution where the raw material solution subsists. Then, it is desirable to cause convection and uniform dispersion of fine particle in the preservation solution by heating the bottom (below the vaporization point of the solvent to the last) in respect of clogging prevention. Moreover, it is more preferable to heat the bottom and to cool the side on the container top. Of course, they shall be heated at the temperature below the vaporization temperature of the solvent.

Further, it is preferable that the heater 21 sets or controls the amount of the heat so that the heat amount of the upper part of the vaporizing tube 20 becomes more than the one of the down stream part. In other words, since the gas cooled by water is jetted out from the dispersion part 8, it is preferable to provide a heater which sets or controls the quantity of heat to be more in the upper part of the vaporizing tube and less in the lower part of it.

Embodiment 2

Figure 5:
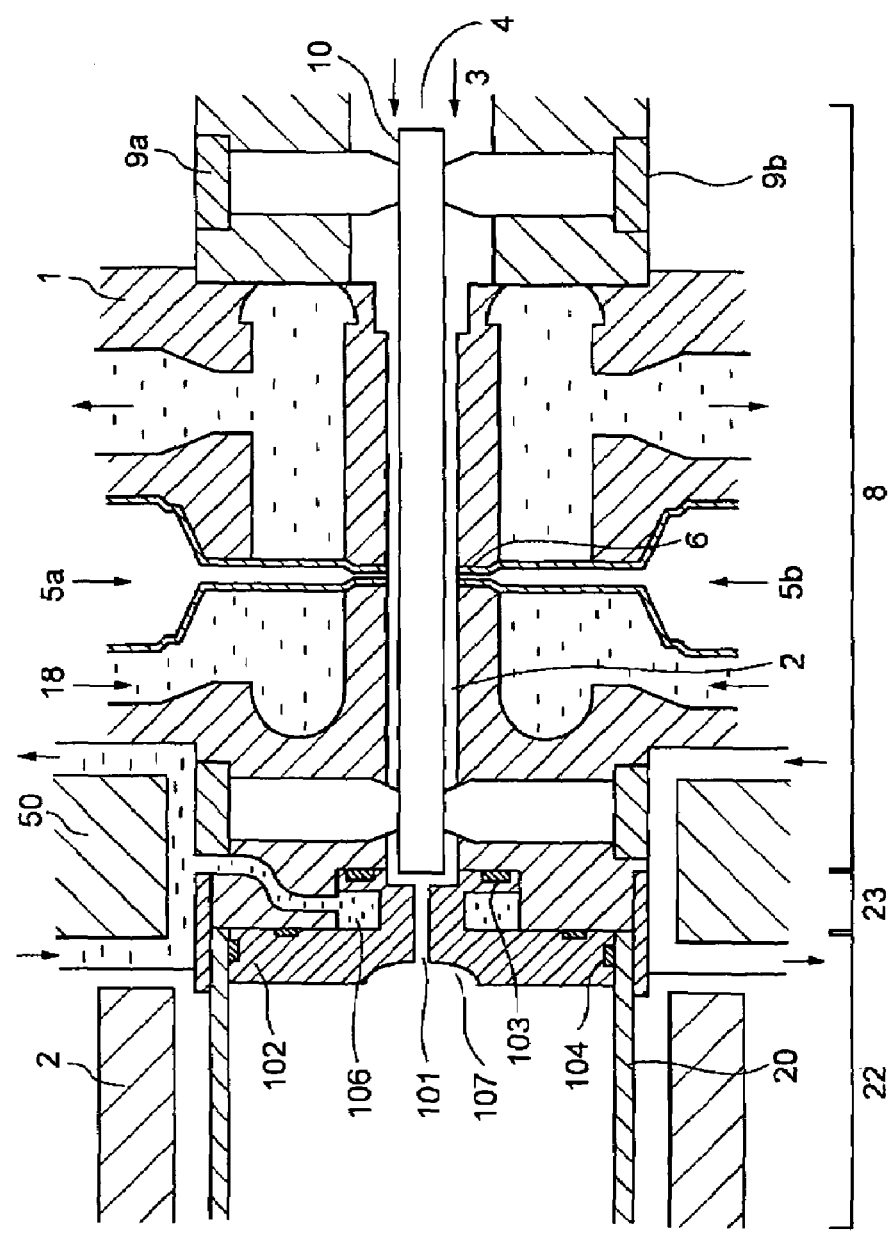
FIG. 5 is a cross-sectional view showing essential parts of a vaporizer for MOCVD according to an embodiment 2.

FIG. 5 shows the vaporizer for MOCVD according to the embodiment 2.

In this embodiment, a cooling water passage 106 was formed around the outer periphery of the radiation prevention part 102, and cooling means 50 was installed around the outer periphery of a connection part 23, and radiation prevention part 102 was cooled. Moreover, a hollow 107 was installed around the outlet of the small hole 101.

Other aspects were made similar to the embodiment 1.

In this embodiment, the detected product agrees better with the product in the reaction formula that had been examined based on the reaction theory than that of the embodiment 1. Moreover, the amount of adhesion of the carbide was about ⅓ times of the case of the embodiment 1, as determined from the measurement of the amount of adhesion of the carbide of on the outer surface on the gas outlet 7 side of the dispersion main body 1.

Embodiment 3

Figure 6:
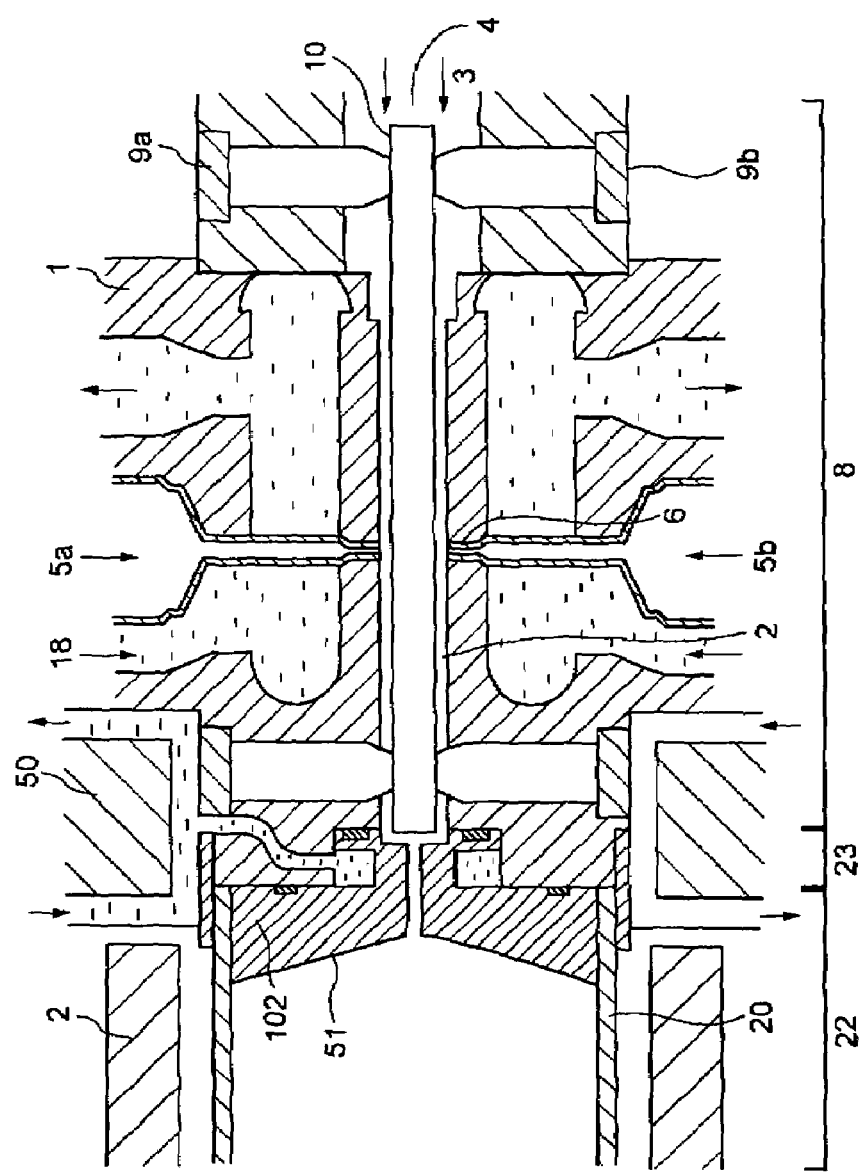
FIG. 6 is a cross-sectional view showing essential parts of a vaporizer for MOCVD according to an embodiment 3.

FIG. 6 shows the vaporizer for MOCVD according to the embodiment 3.

In this embodiment, taper 51 is installed in radiation prevention part 102. The dead zone in the concerned part disappears because of this taper 51, and the stagnation of raw material can be prevented.

Other aspects were made similar to the embodiment 2.

In this embodiment, the detected product agrees better with the product in the reaction formula that had been examined based on the reaction theory than that of the embodiment 2. Moreover, the amount of adhesion of the carbide was almost null, as determined from the measurement of the amount of adhesion of the carbide of on the outer surface on the gas outlet 7 side of the dispersion main body 1.

Embodiment 4

Figure 7:
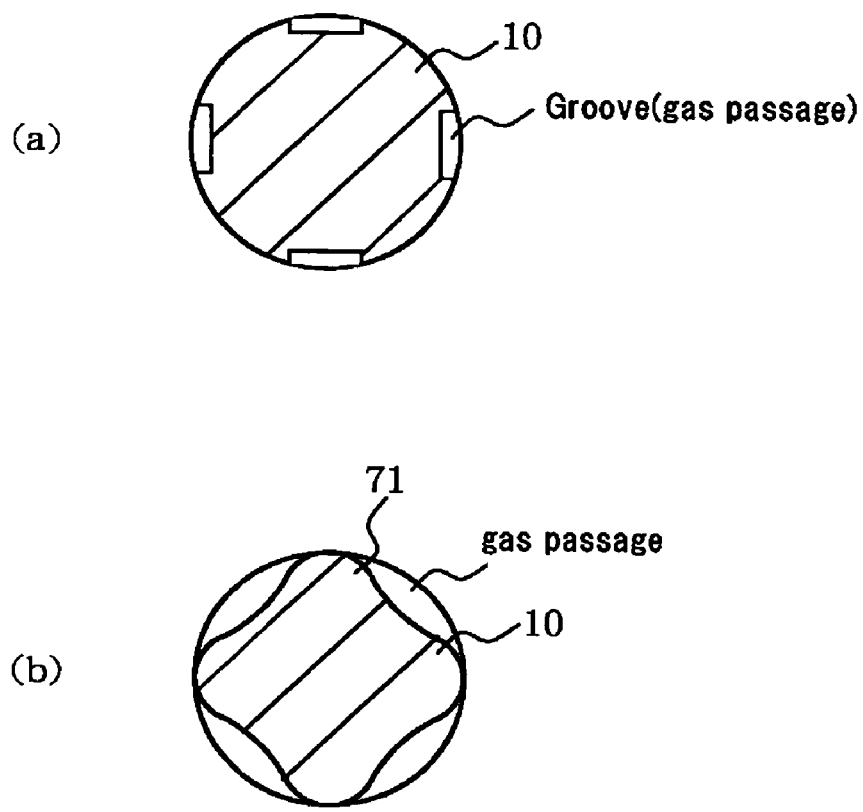
FIGS. 7 (a) and (b) are cross-sectional views showing a variant of a gas passage of a vaporizer for MOCVD, both according to an embodiment 4.

FIG. 7 shows the modification embodiment referring to the gas passage.

The groove 70 is formed on the surface of a rod 10, and the outer diameter of rod 10 is made substantially the same as the inner diameter of the hole perforated in the inside of the dispersion main body 1 in FIG. 7(*a*). Therefore, the rod 10 can be disposed in the hole without deviation by only setting the rod 10 in the hole. Moreover, a screw etc. need not be used. This groove 70 becomes the gas passage.

Note that a plurality of grooves 70 may be formed in parallel to the longitudinal central axis of the rod 10 or spirally on the surface of the rod 10. Spiral grooves can make a raw material gas more uniform.

FIG. 7(*b*) is an example of installing the mixture part in the tip part of the rod 10. The largest diameter of the tip part is made almost the same as the diameter of the hole perforated in the interior of the dispersion main body 1. The space formed by the tip part of the rod and the inner face of the hole becomes a gas passage.

Obviously, the gas passage may be formed by using the rod of a circular cross section as a rod and installing a concave portion in the hole, though the example shown in Figs. (a) and (b) is an example of executing the processing to the surface of the rod 10. It is preferable to set up the rod with about H7×h6 to JS7 provided by JIS for instance.

Embodiment 5

Figure 8:
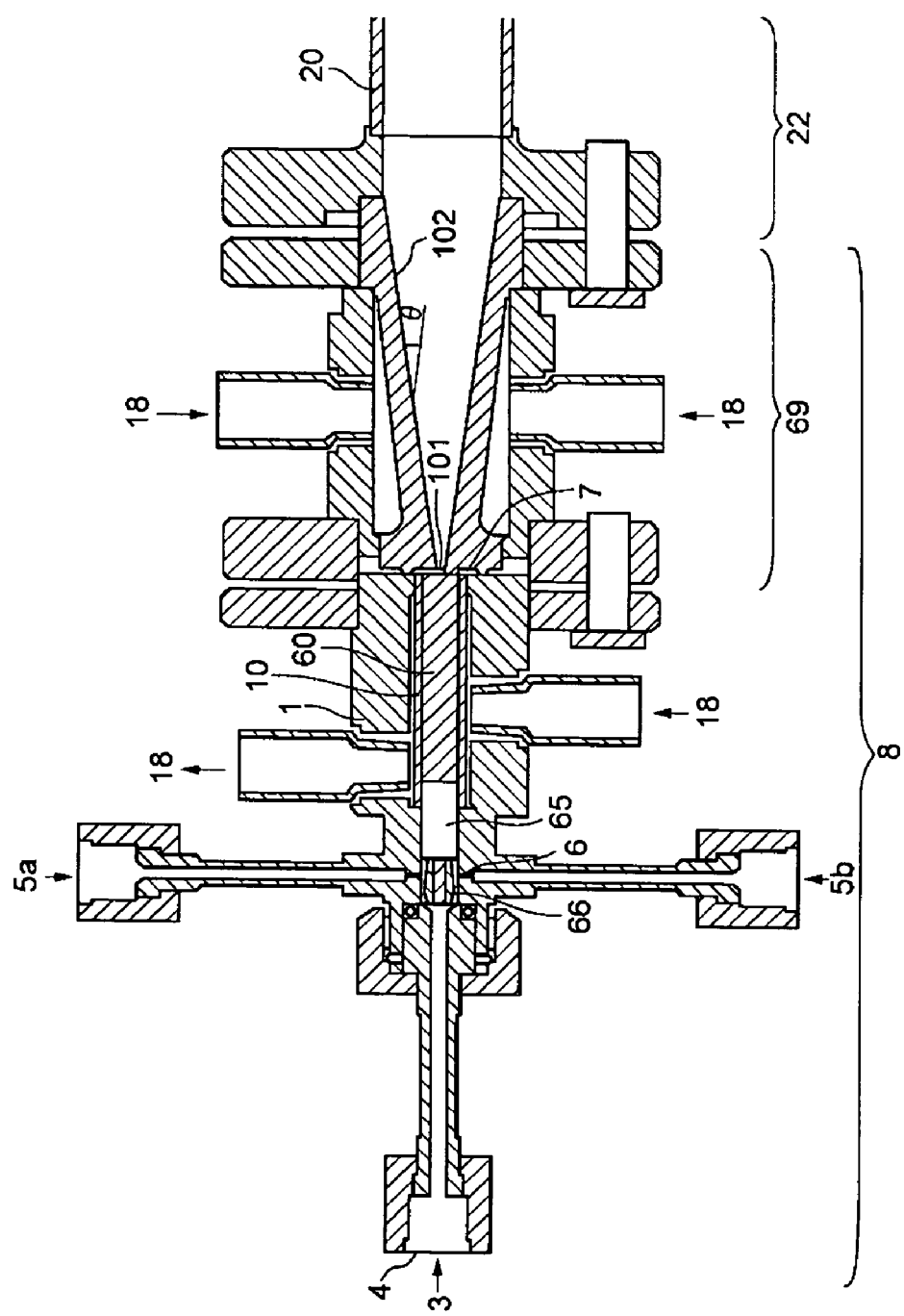
FIG. 8 is a cross-sectional view showing a vaporizer for MOCVD according to an embodiment 5.

The embodiment 5 shall be described based on FIG. 8.

The vaporizer for MOCVD of this embodiment has a dispersion part 8 including a gas passage 2 formed internally, a gas inlet 4 to introduce a pressurized carrier gas 3 into the gas passage, a means to supply the raw material solution 5a, 5b to the gas passage, and a gas outlet 7 to send the carrier gas including the raw material solution 5a, 5b to the vaporization part 22; and a vaporization part 22 for heating the carrier gas including the raw material solution and vaporizing the raw material solution, sent from the dispersion part 8. The vaporization part 22 includes a vaporization tube 20 whose one end is connected to a reaction part of the MOCVD unit and whose other end is connected to the gas outlet 7; and a heating means 21 to heat the vaporization tube 20. The dispersion part 8 comprises a dispersion main body 1 having a cylindrical hollow part and a rod 10 having an outer diameter smaller than the inner diameter of the cylindrical hollow part. The rod 10 has one or more spiral groove(s) 60 on the vaporizer 22 side of the outer periphery of the rod, and the rod 10 is inserted in the cylindrical hollow part. Further, a radiation prevention part 101 having a small hole 101 and an inner diameter expanding in taper towards the vaporizer 22 side is installed outside the gas outlet 7.

When the raw material solution 5 is supplied to the gas passage where high-speed carrier gas 3 flows, the raw material solution is shorn and atomized. That is, the raw material solution that is liquid is shorn by the high speed flow of the carrier gas and is made into particles. The raw material solution made into particles is dispersed in the carrier gas in the particle state. This aspect is similar to the embodiment 1.

The following conditions are preferable to execute shearing and atomization optimally. It is preferable to supply raw material solution 5 by 0.005 to 2 cc/min, preferably by 0.005 to 0.02 c/min, and more preferably by 0.1 to 0.3 cc/min. When two or more raw material solutions (containing solvent) are supplied at the same time, it concerns their total amount. Moreover, it is preferable to supply the carrier gas at the speed of 10 to 200 m/sec, and 100 to 200 m/sec is more preferable.

Obviously, the flowing quantity of the raw material solution and the flowing quantity of the carrier gas are correlated, and the passage sectional area and shape shall be selected for the best achievement of shearing and atomization so that an ultrafine particle mist may be obtained.

In this embodiment, spiral grooves 60 are formed around the outer periphery of the rod 10, and a gap space exists between the dispersion main body 1 and the rod 10. Consequently, the carrier gas, including the raw material solution that became the atomized state, goes straight in this gap space as a straightly advancing flow, and at the same time, forms a rotating flow along the spiral groove 60.

Thus, the present inventor found that the raw material solution atomized in a state where the straightly advancing flow and the rotating flow are concomitant is uniformly dispersed in the carrier gas. The reason why a uniform dispersion can be realized when the straightly advancing flow and the rotating flow are concomitant is not necessarily clear. However, it can be supposed as follows. By the existence of the rotating flow, the centrifugal force works on the flow, and secondary flows are caused. The mixture of the raw material and the carrier gas is promoted by these secondary flows. That is, a secondary derivation flow is caused by the centrifugal effect of the rotating flow in a perpendicular direction to the flow, and, as a result, it seems that the atomized raw material solution is dispersed more uniformly in the carrier gas.

Now, this embodiment shall be described more in detail as follows. In this embodiment, it is composed to supply four kinds of raw material solutions 5a, 5b, 5c, and 5d (5a, 5b, and 5c are organometallic raw materials and 5d is a solvent raw material such as THF) to the gas passage as one example.

In order to mix the carrier gas (called, "raw material gas") including the raw material solution that became respectively mist and ultrafine particles, a part without a spiral groove is installed in the downstream of the portion corresponding to the raw material supply hole 6 of the rod 10, in this embodiment. This portion becomes a pre-mixing part 65. In the pre-mixing part 65, the raw material gases of three kinds of organic metals are mixed to some degree, and, in addition, becomes a complete mixture raw material gas in an area of a helical structure in the downstream thereof. As for the length of this mixing part 65, 5 to 20 mm is preferable, and 8 to 15 mm is more preferable to obtain a uniform mixture raw material gas. Outside this range, a mixture raw material gas in which only one kind of the three organometallic raw material gasses is denser than two other organometallic raw material gasses might be sent to the vaporization part 22.

In this embodiment, a parallel part 67 and a taper part 58 are installed at an edge 66 on the upstream side of the rod 10. The cylinder hollow part of the dispersion main body 1 is provided with a parallel part having the same inner diameter as the outer diameter of the parallel part 67 of the rod 10, and a taper part that is the same taper as the taper of the rod 10 corresponding to the parallel part 67 and the taper part 58. Therefore, if the rod 10 is inserted from the top left side on the drawing, the rod 10 is maintained in the hollow part of the dispersion main body 1.

Different from the embodiment 1, even if a carrier gas of a higher pressure than 3 kgf/cm$^2$ is used, the rod 10 can be prevented from being moved, because the taper is provided to hold the rod 10, in this embodiment. That is, if the maintenance technology shown in FIG. 8 is adopted, the carrier gas can be flowed at a pressure of 3 kg/cm$^2$ or higher. As a result, it becomes possible to reduce the sectional area of the gas passage and to supply a higher speed carrier gas with a small amount of gas. That is, the supply of a high-speed carrier gas at 50 to 300 mm/sec becomes possible, too. If this maintenance technology is adopted, it is similar also for the aforementioned other embodiments.

Figure 9:
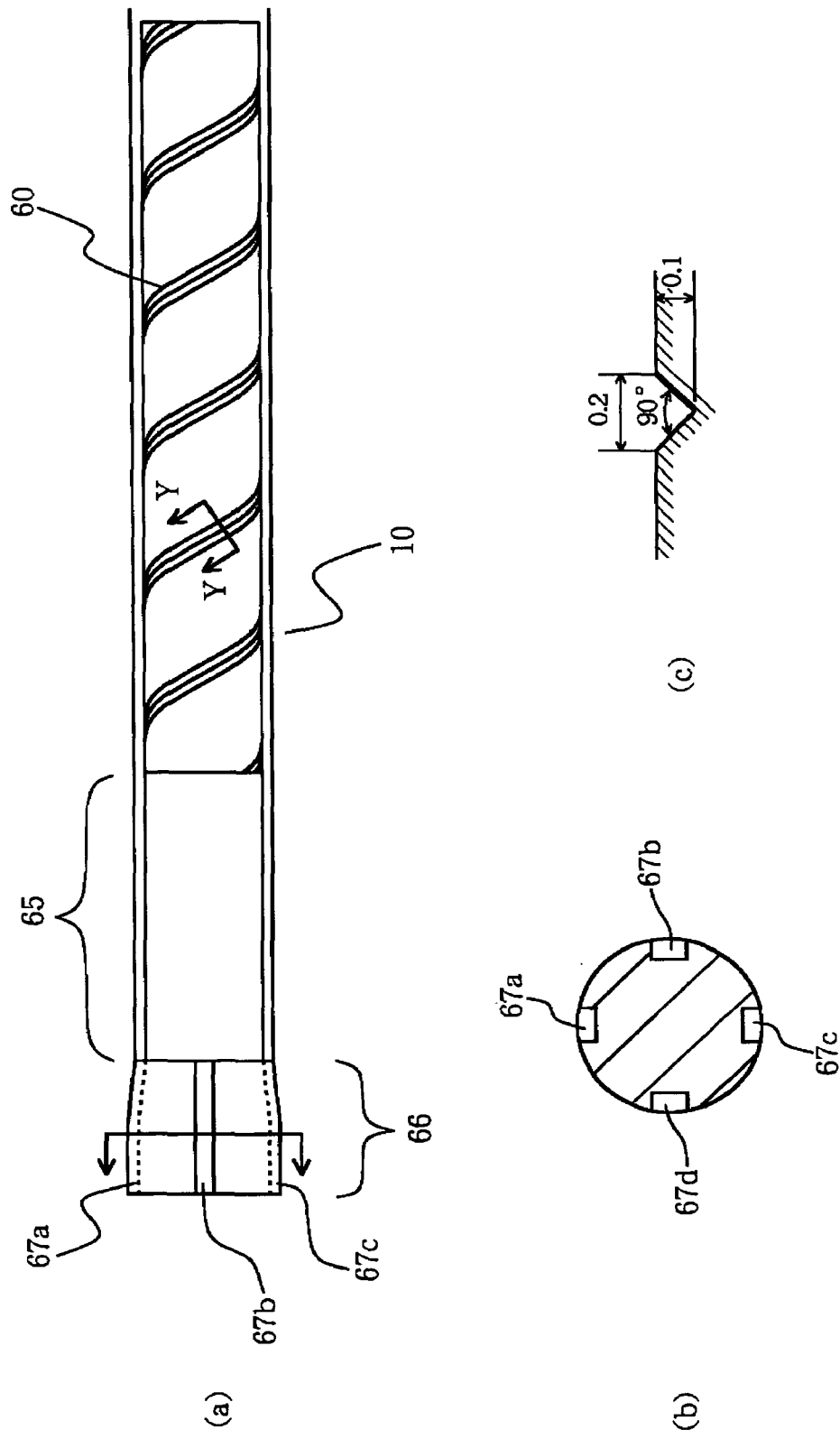
FIG. 9 shows a rod used for the vaporizer for MOCVD according to the embodiment 5, (a) being a side view thereof, (b) an X—X cross-sectional view, and (c) a Y—Y cross-sectional view.
Figure 10:
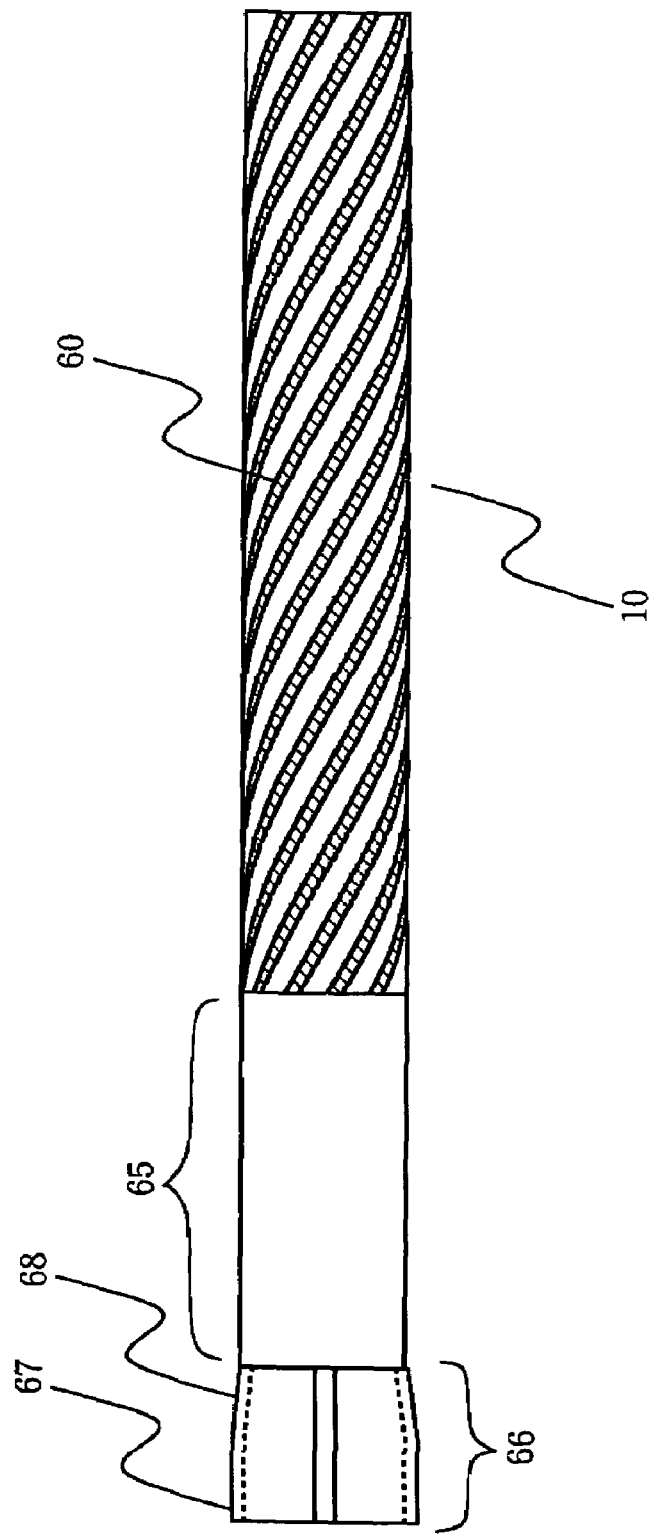
FIG. 10 is a side view showing a variant of FIG. 9(a)

The grooves 67a, 67b, 67c, and 67d are formed as a passage for the carrier gas, in a portion corresponding to the raw material supply hole 6 of the rod 10, as shown in FIG. 9(*b*). 0.005 to 0.1 mm is preferable as the depth of each groove 67a, 67b, 67c and 67. Molding of the groove becomes difficult if less than 0.005 mm. Moreover, 0.01 to 0.05 mm is more preferable. The clogging or other is not generated by making it within this range. Moreover, it is easy to obtain a high-speed flow. The composition shown in FIG. 1 for the embodiment 1 and other compositions may be adopted for the maintenance of the rod 10 and the formation of the gas passage. The number of spiral groove 60 may be single as shown in FIG. 9(*a*) but it may also be two or more as shown in FIG. 10. Moreover, they may be crossed when two or more spiral grooves are formed. The raw material gas dispersed more uniformly is obtained when they are crossed. However, a cross sectional area of each groove is set to allow the gas flow velocity to be 10 m/sec or more. The size and shape of the spiral groove are not especially limited, and the size and shape shown in FIG. 9(c) are raised as one example.

In this embodiment, the gas passage is cooled with cooling water 18 as shown in FIG. 8.

Moreover, an expansion part 69 is independently installed in this side of the entrance of dispersion part 22 in this embodiment, and a longitudinal radiation prevention part 102 is arranged in this expansion part. A small hole 101 is formed on the gas outlet 7 side of the radiation prevention part, and its inner diameter spreads out in the taper-shape toward the vaporizer side. This expansion part 69 is also a portion to prevent the stay of the raw material gas described for the embodiment 3. Of course, the expansion part 69 need not be independently installed, and an integrated composition as shown in FIG. 6 may also be adopted.

An angle of from 5 to 10 degrees is preferable as the expansion angle θ for the expansion part 69. The raw material gas can be supplied to the dispersion part without destroying the rotating flow when θ is in this range. Moreover, when θ is within this range, the fluid drag by the expansion is minimized, the existence of a dead zone is minimized, and the existence of a vortex by the existence of the dead zone can be minimized. Note that the angle of from 6 to 7 degrees is more preferable as θ. The range of preferable θ is similar also in the embodiment shown in FIG. 6.

Embodiment 6

The raw material solution and the carrier gas were supplied under the following conditions, using the device shown in FIG. 8, and the uniformity in the raw material gas was examined.

Amount of introduced raw material solution:

| | |
|---|---|
| $Sr(DPM)_2$ | 0.04 cc/min |
| $Bi(C_6H_5)_3$ | 0.08 cc/min |
| $Ta(OC_2H_5)_5$ | 0.08 cc/min |
| THF | 0.2 cc/min |

Carrier gas: Nitrogen gas
10~350 m/s

The device shown in FIG. 8 was used as the vaporization device. However, the rod 10 where a spiral groove was not formed as shown in FIG. 9, was used as the rod. The raw material solution is supplied from the raw material supply hole 6, while the carrier gas is changed in speed variously. The groove 67a was supplied with $Sr(DPM)_2$, groove 67b with $Bi(C_6H_5)_3$, groove 67c with $Ta(OC_2H_5)_5$ and groove 67d with solvent such as THF, respectively, from the raw material supply hole. Heating in the vaporization part was not executed, the raw material gas was collected at the gas outlet 7, and the particle diameter of the raw material solution was measured in the collected raw material gas.

Figure 11:
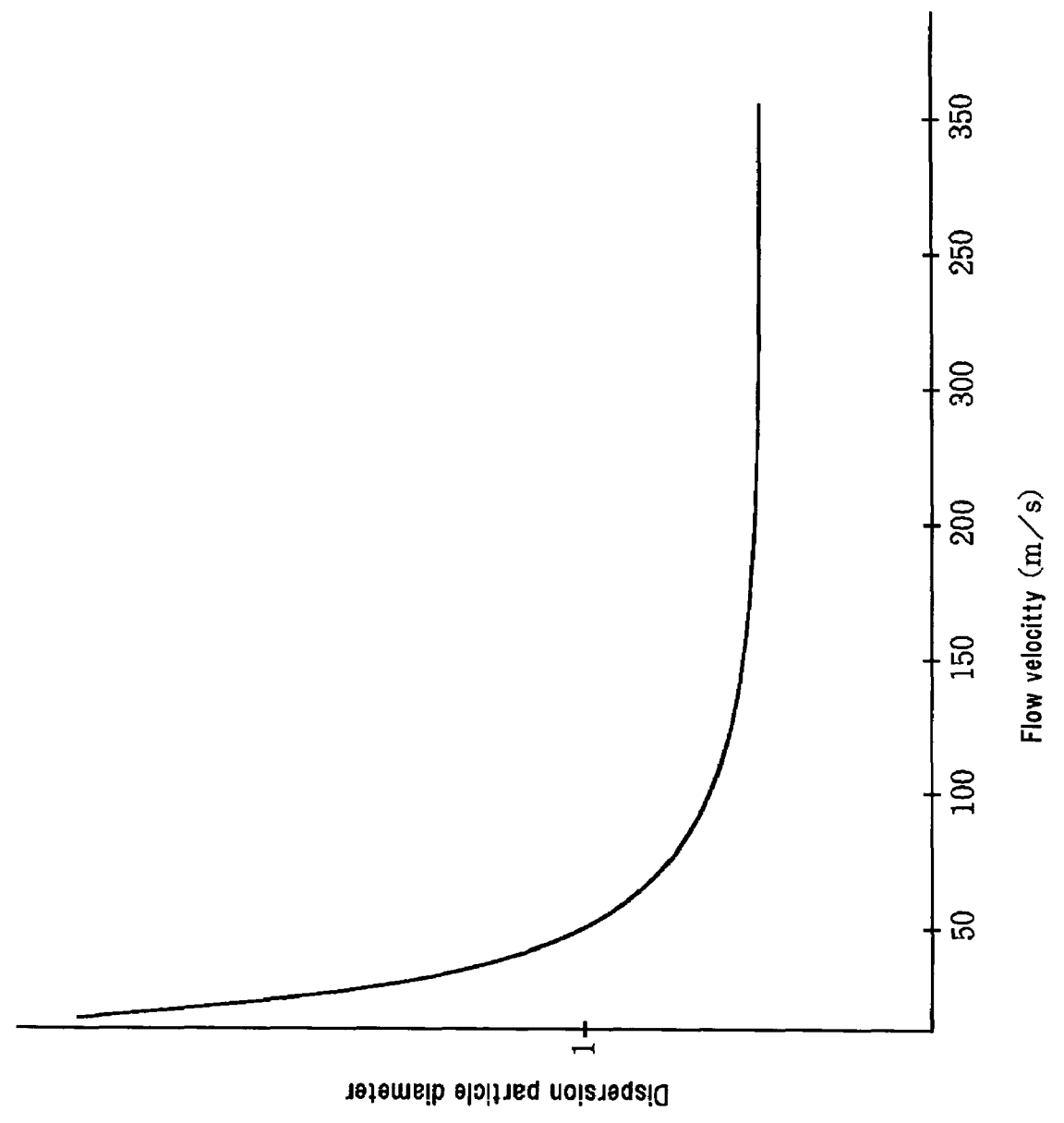

The results are shown in FIG. 11 as relative values (the case with a device according to an example of the prior art shown in FIG. 12(a) is set to be 1). The dispersion particle diameter becomes smaller by setting the flow velocity to 50 m/sec or more as understood from FIG. 11, and the dispersion particle diameter becomes still smaller by setting the flow velocity to 100 m/sec or more. However, the dispersion particle diameter is saturated even if set to 200 m/sec or more. Therefore, 100 to 200 m/sec is a more preferable range.

Embodiment 7

In this embodiment, a rod 10 where a spiral groove had been formed was used as a rod.

Other aspects were the same as the embodiment 6.

The density of the raw material solution that had been supplied to the groove was high in the groove extension part, in the embodiment 6. That is, respectively the density of one raw material solution was higher than others in each extension part of the groove through which it came. The density of $Sr(DPM)_2$ was higher than that of the others in the extension part of the groove 67a, $Bi(C_6H_5)_3$ in the extension part of the groove 67b, and $Ta(OC_2H_5)_5$ in the extension part of the groove 67c. However, in this embodiment, each organometallic raw material of the mixture raw material gas that had been obtained on the edge of a spiral groove was uniform in any part.

Embodiment 8

Figure 12:
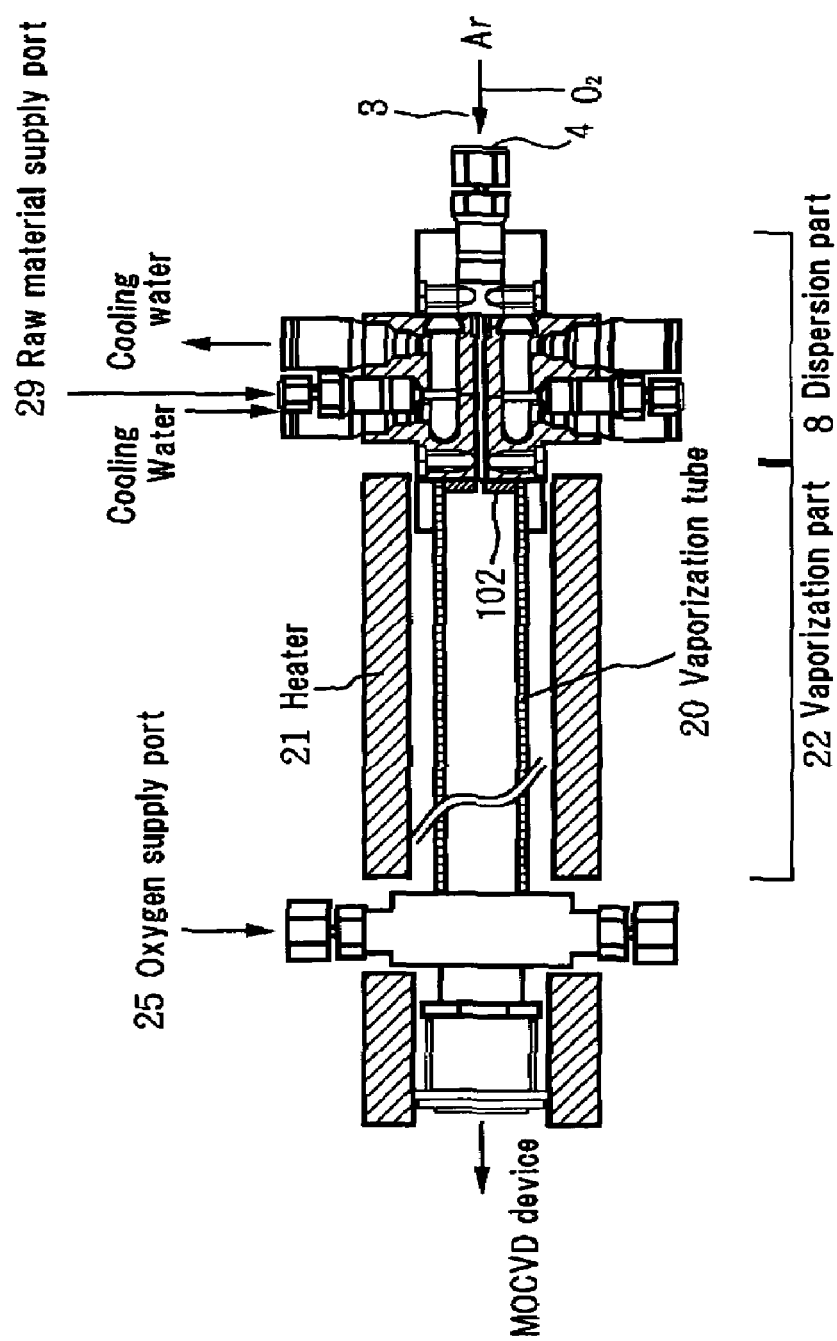
FIG. 12 is a side cross-sectional view showing an embodiment 8.
Figure 13:
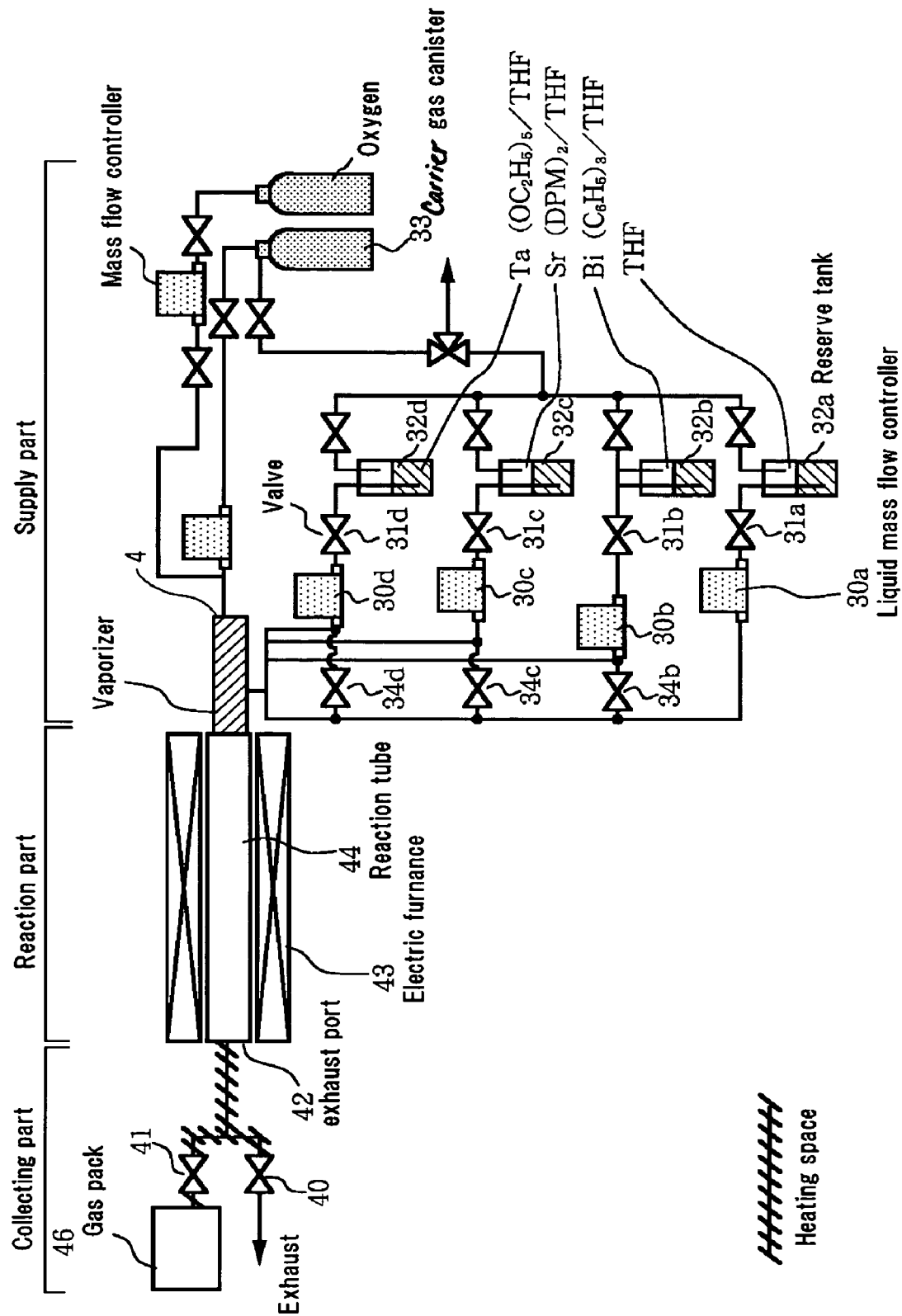
FIG. 13 is a conceptual diagram to show a gas supply system of the embodiment 8.

FIG. 12 and FIG. 13 show the embodiment 8.

Oxygen had been introduced only downstream of the vaporization part 22 as shown in FIG. 2 in the prior art. As described in the discussion of the prior art, a large amount of carbon is contained in the film formed by the prior art. Moreover, there was a difference between the composition allocation in the raw material and the composition allocation in the deposited film. That is, when the raw material was adjusted to the composition ratio of the stoichiometric mixture ratio, vaporized, and deposited, the actually deposited film turned out a composition film that deviated from the stoichiometric mixture ratio. Especially, a phenomenon that bismuth is hardly included (about 0.1 at %) was observed.

Figure 20:
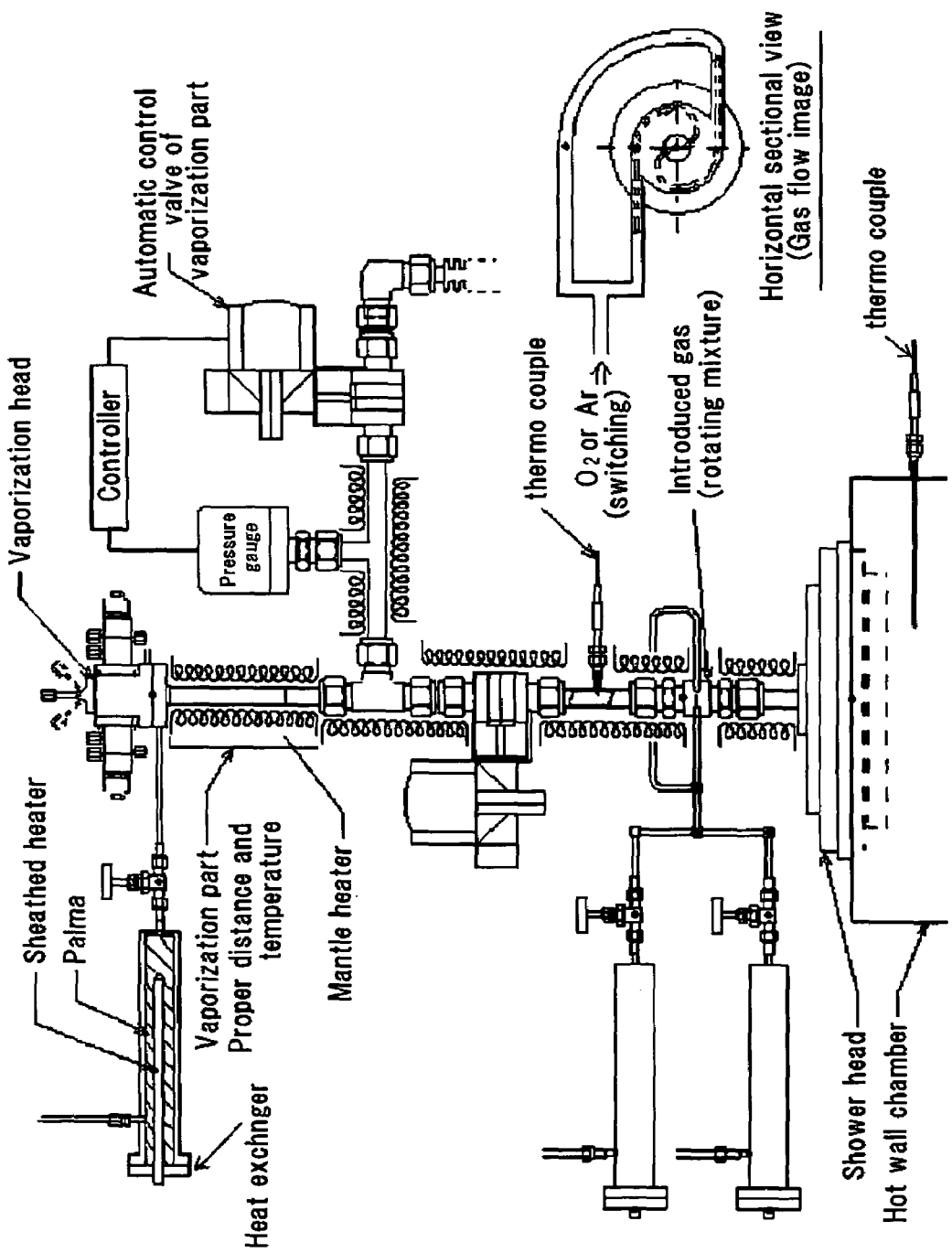
FIG. 20 is a general view of a vaporizer.

The present inventor found the cause thereof relates to the position where oxygen was introduced. That is, it has been understood that, if oxygen is introduced from the gas inlet 4, a secondary oxygen supply port 200 nearest the jet port, and the oxygen inlet 25 (first oxygen supply port) with the carrier gas as shown in FIG. 20, the difference of composition ratio between the composition in the formed film and the composition in the raw material solution can be extremely minimized. The carrier gas and oxygen may be mixed beforehand, and their mixed gas may be introduced from the gas inlet 4.

Embodiment 9

Figure 19:
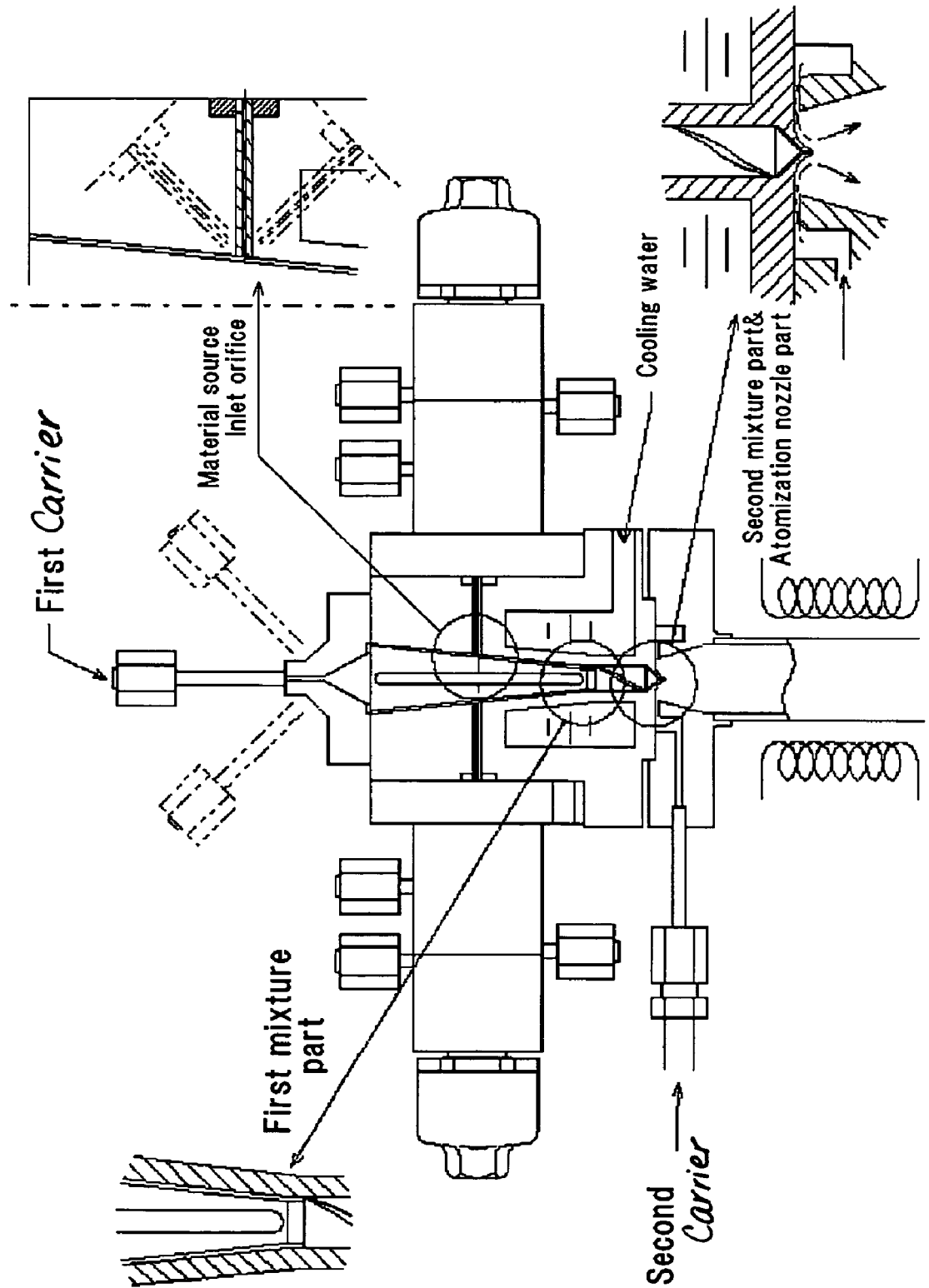
FIG. 19 is a vaporizer detail view.
Figure 21:
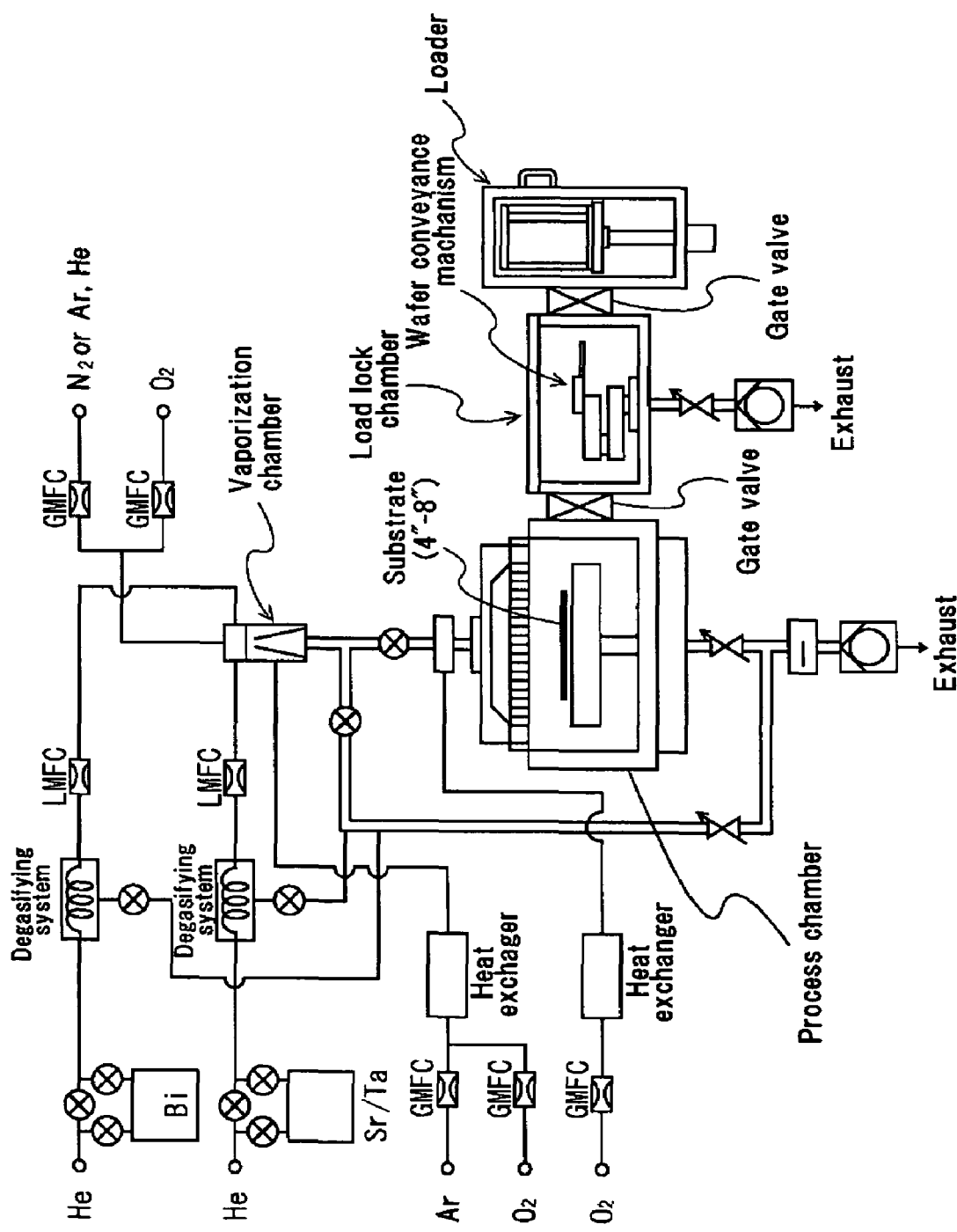
FIG. 21 is an example of SBT thin film CVD unit using a vaporizer.

The SBT film was formed by a vaporizer shown in FIGS. 19 and 20, and a CVD device shown in FIG. 21, and then the polarization characteristic and others were evaluated. More concretely, the vaporizer condition and the reaction chamber condition were controlled as follows, and the SBT thin film was formed on a substrate that applied platinum 200 nm on an oxidized silicon substrate body.

Concrete conditions:

Hexaethoxy strontium tantalum $Sr[Ta(OC_2H5)_6]_2$ 0.1 mole solution (Solvent: Hexane) 0.02 ml/min Tori-t-amyloxide bismuth $Bi(O-t-C_5H_{11})_3$ 0.2 mole solution (Solvent: Hexane) 0.02 ml/min First carrier Ar=200 sccm (introduced into the gas inlet 4)

First carrier $O_2$=10 sccm (introduced into the gas inlet 4)

Second carrier Ar=20 sccm (introduced into the gas inlet 200)

Second carrier $O_2$=10 sccm (introduced into the gas inlet 200)

Reactant oxygen $O_2$=200 sccm (introduced into lower part 25 of the dispersion jet part)

Reactant oxygen temperature 216° C. (control the temperature by a separately installed heater before introducing from the lower part of the dispersion jet part)

| Wafer temperature | 475° C. |
|---|---|
| Space temperature | 299° C. |
| Space distance | 30 mm |
| Temperature of shower head | 201° C. |
| Reaction pressure | 1 Torr |
| Deposition time | 20 minutes |

As a result,

SBT film thickness about 300 nm (depositing speed about 150 nm/min)

| SBT composition | Sr | 5.4 at % |
|---|---|---|
| | Bi | 16.4 at % |
| | Ta | 13.1 at % |
| | O | 61.4 at % |
| | C | 3.5 at % |

The difference of the composition ratio between the composition in the formed film and the composition in the raw material solution was small, and the depositing speed became about five times as fast as that of the prior art. It can be said that it is extremely effective to introduce a small amount of oxygen from the gas inlet 4 with the carrier gas. The content of the carbon is as low as 3.5 at %.

A large effect of controlling re-condensation/sublimation (solidification) of the vaporized organometallic compound was confirmed by the fact that the dirt disappeared from lower part of the vaporization tube, because the temperature of the reactant oxygen 200 cc/min was accurately controlled (at 216° C.) by a separately installed heater before the reactant oxygen was introduced from the lower part of the dispersion jet part.

Figure 17:
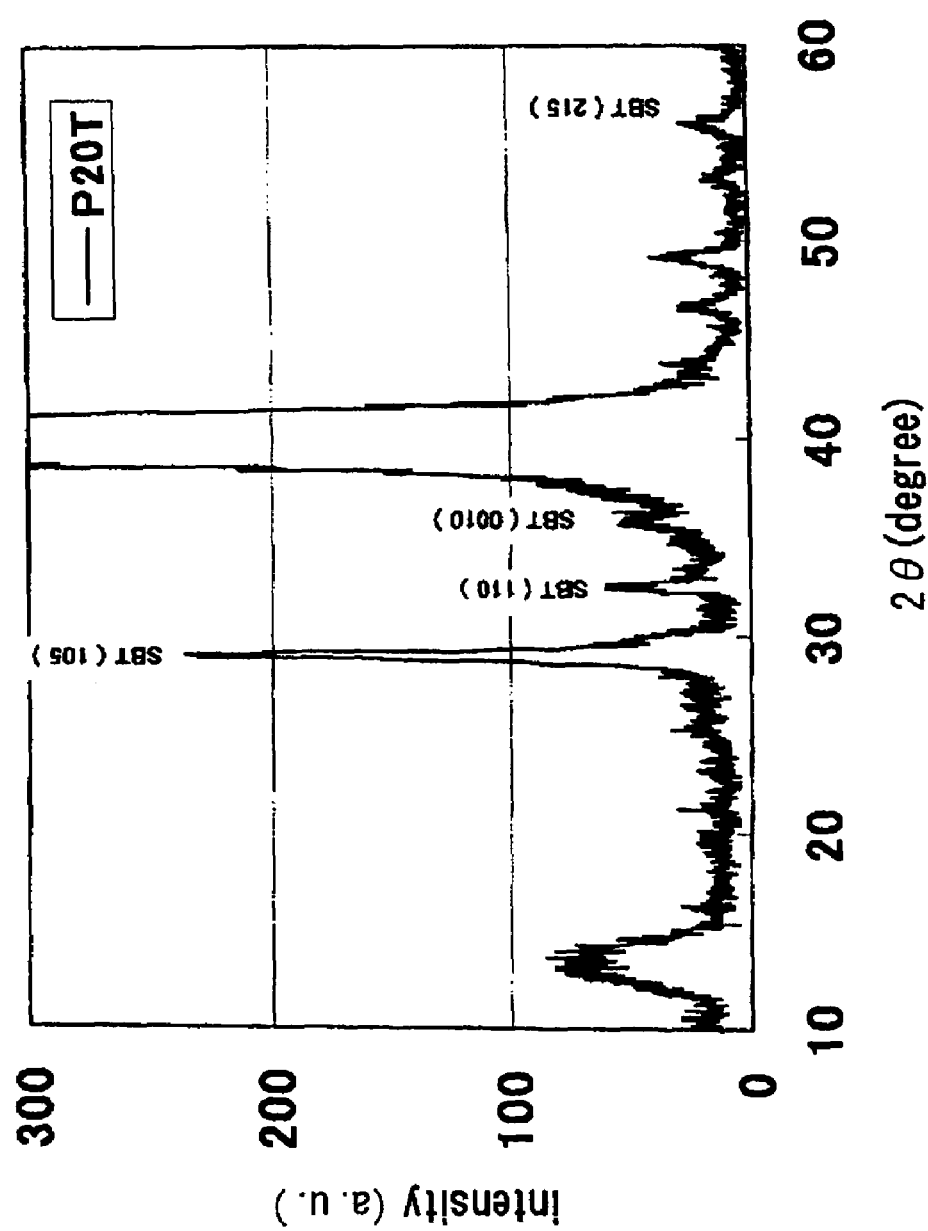
FIG. 17 is a graph showing crystallization characteristics of a SBT thin film.
Figure 18:
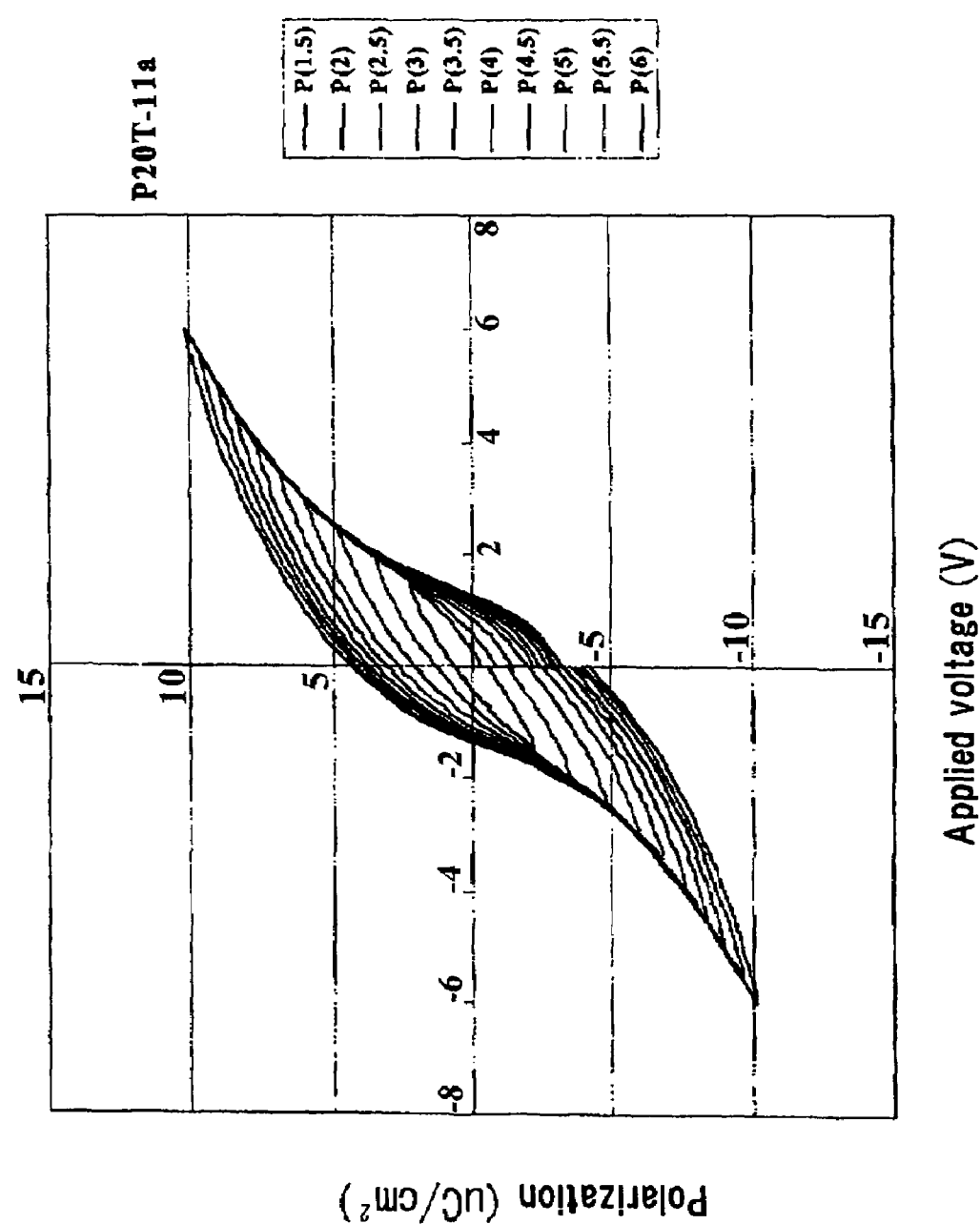
FIG. 18 is a graph showing polarization characteristics of the crystallized SBT thin film.

After the SBT thin film had been formed, it was put under the crystallization process at 750° C. for 30 minutes under the oxygen atmosphere to form an upper electrode, and then excellent crystallization and polarization characteristics were found by the measurement and the evaluation. This is shown in FIGS. 17 and 18.

As shown in FIG. 2, it is preferable to control the amount of oxygen appropriately by introducing oxygen simultaneously to the downstream of the vaporization part in order to reduce the difference of the composition ratio, and to decrease the carbon content, provided that oxidizing gas such as oxygen is introduced from the gas inlet 4 or the primary oxygen supply port closest to the jet port. The content of carbon in the formed film can be decreased by 5 to 20% compared to the prior art. The SBT thin film deposition process shall be described by using FIG. 20. The second valve is opened, the first valve is shut, and a few minutes after the reaction chamber is drawn to a high vacuum, the wafer is transferred from the loading lock chamber to the reaction chamber. At this moment, Hexaethoxy strontium tantalum $Sr[Ta(OC_2H5)_6]_2$ 0.1 mole solution (Solvent: Hexane)

0.02 ml/min

Tori-t-amyloxide bismuth $Bi(O-t-C_5H_{11})_3$ 0.2 mole solution (Solvent: Hexane)

0.02 ml/min

First carrier Ar=200 sccm (introduced into the gas inlet 4)

First carrier $O_2$=10 sccm (introduced into the gas inlet 4)

flow into the vaporizer and are drawn to the vacuum pump via the second valve and the automatic pressure regulating valve. The pressure gauge is controlled by the automatic pressure regulating valve to 4 Torr, at this time.

A few minutes after the wafer is transferred, if the temperature is steady, the following gas flows into the reaction chamber thereof, the first valve is opened and the second valve is shut to start depositing.

Hexaethoxy strontium tantalum $Sr[Ta(OC_2H5)_6]_2$ 0.1 mole solution (Solvent: Hexane) 0.02 ml/min Tori-t-amyloxide bismuth $Bi(O-t-C_5H_{11})_3$ 0.2 mole solution (Solvent: Hexane) 0.02 ml/min First carrier Ar=200 sccm (introduced into the gas inlet 4)

First carrier $O_2$=10 sccm (introduced into the gas inlet 4)

Second carrier Ar=20 sccm (introduced into the gas inlet 200)

$O_2$=10 sccm (introduced into the gas inlet 200)

Reactant oxygen $O_2$=200 sccm (introduced into the lower part 25 of the dispersion jet part)

Reactant oxygen temperature 216° C. (control the temperature by a separately installed heater before introducing from the lower part of the dispersion jet part)

Wafer temperature 475° C.

The pressure of the reaction chamber is controlled at 1 Torr (by an automatic pressure regulating valve not shown).

When a required time (in this case 20 minutes) has passed, the second valve is opened and the first valve is shut to terminate the deposition.

One minute after the gas in the reaction chamber is drawn to a high vacuum to remove the reactant gas completely, the wafer is taken out to the loading lock chamber.

Capacitor Structure

Pt (200 nm)/CVDSBT (300 nm)/Pt (175 nm)/Ti (30 nm)/$SiO_2$/Si

Capacitor Preparation Process

Lower part electrode formation Pt (175 nm)/TI (30 nm)

CVDSBT film formation (300 nm)

SBT film crystallization processing (diffusion furnace anneal: Wafer 750, 30 min, $O_2$ atmosphere)

Upper part electrode formation Pt (200 nm)

Anneal: 650° C., $O_2$, 30 min

Conventionally, since the reaction oxygen (example, 200 sccm) was put in the vaporizing tube in a room temperature, the organic metal gas was cooled, adhered and accumulated to the vaporizing tube.

Conventionally, when temperature control of the reaction oxygen supplied from a lower part of the vaporizing part was conducted, the temperature of an external wall of a stainless pipe was controlled (example: 219° C.) by winding up the heater to the outside of the stainless steel pipe (¼ inches in external form, 10 to 100 cm in length).

It was thought that the temperature of the external wall of the stainless steel pipe (example: 219° C.) was the temperature of the oxygen flowing inside the pipe (quantity of flow 200 sccm).

However, in the above mentioned example, it was found that the temperature went up to about only 35° C. when measured by a minute thermocouple.

Therefore, the temperature of the oxygen was precisely controlled by directly measuring the temperature of the oxygen with a minute thermocouple after the heating thereof and by controlling the temperature of the heater. It was not easy to raise the temperature of the gas, such as oxygen flowing through the pipe, so filler was put in a heating pipe to improve the efficiency of heat exchange. Moreover, the temperature of the heated oxygen gas was measured, and the temperature of heater was appropriately controlled. The heat exchanger shown in the FIG. 20 is the means for the control.

Embodiment 10

Figure 14:
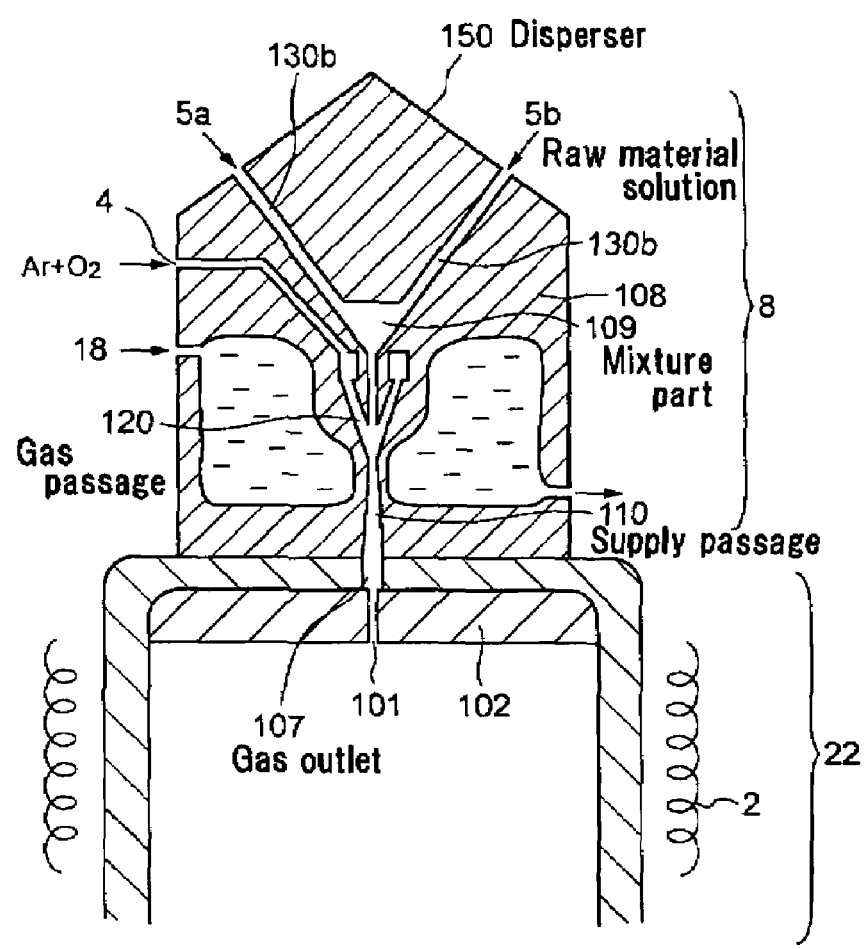
FIG. 14 is a cross-sectional view showing an embodiment 9.
Figure 15:
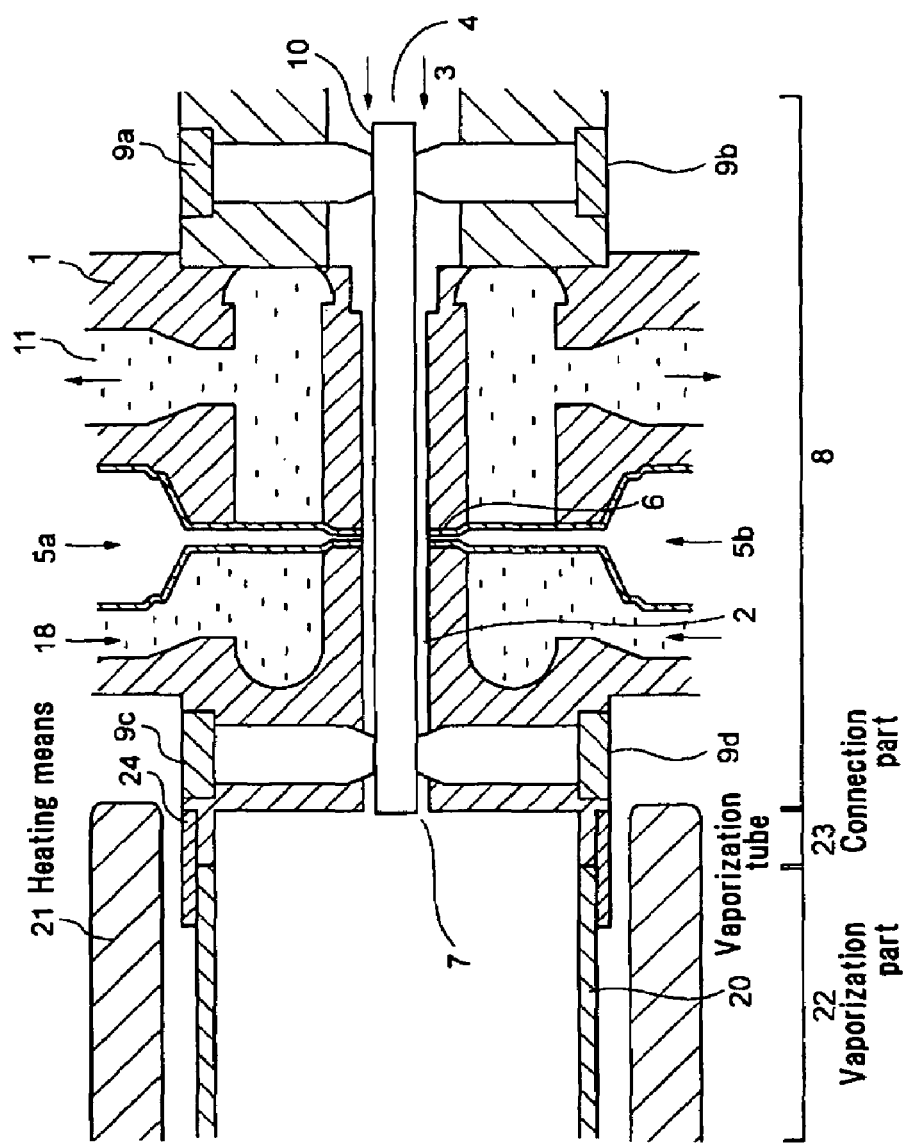
FIG. 15 is a cross-sectional view showing the nearest prior art.
Figure 16:
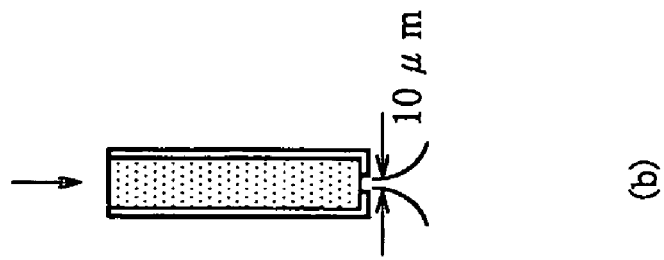
FIGS. 16 (a) and (b) both are cross-sectional views showing the vaporizer for MOCVD of the prior art.
Figure 16:
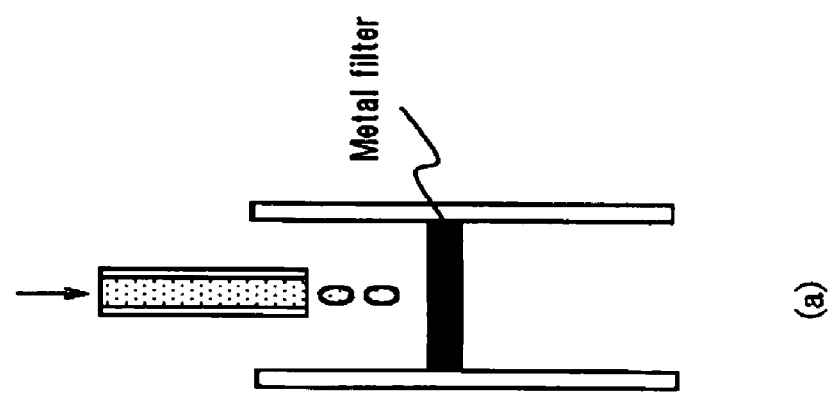

Embodiment 10 is shown in FIG. 14.

The aforementioned embodiment is a device in which the single raw material solution is atomized by spraying the gas on each of it, and then, the atomized raw material solution was mixed. However, the present embodiment is a device in which a plurality of the raw material solution is mixed and, next, the mixed raw material solution is atomized.

This embodiment has a disperser 150, having a plurality of solution passages 130*a*, 130*b* for supplying raw material solution 5*a*, 5*b*; a mixture part 109 for mixing a plurality of raw material solutions 5*a*, 5*b* supplied from a plurality of solution passages 130*a*, 130*b*; a supply passage 110 of which one end communicates with the mixture part 109 and which has an outlet 107 of the vaporization part 22 side; a gas passage 120 arranged to spray the carrier gas or the mixed gas of the carrier gas and oxygen to the mixture raw material solution from the mixture part 109, in the supply passage 110; and a cooling means to cool the supply passage 110. This embodiment also has and a vaporizer having a radiation prevention part 102 having a small hole 101 outside the gas outlet 107; a vaporization part 22 for heating the carrier gas including the raw material solution and for vaporizing the raw material solution, sent from the disperser 150; a vaporization tube whose one end is connected to a reaction pipe of a MOCVD unit and whose other end is connected to the outlet 107 of the disperser 150, and a heating means to heat the vaporization tube.

The present embodiment is effective for the raw material solution whose reaction does not progress evenly when mixed. Moreover, since the raw material solution is atomized after being mixed, it has a more accurate composition ratio than the case where the solution is mixed after it is atomized. Further, if a means to analyze the composition of the raw material solution (not shown) in the mixture part 109 is provided and the amount of supply of the raw material solution 5*a*, 5*b* is controlled based on the result of the analysis, the more accurate composition ratio can be obtained.

In addition, because it is not necessary to use the rod (10 of FIG. 1) in this embodiment, the heat that is transmitted with the rod does not heat the inside of the supply passage 110. Moreover, a cross sectional area of the supply passage 110 can be smaller than that of the case where the material solution is mixed after atomization. In addition, since the cross sectional area of the outlet 107 can be smaller, the inside of the supply passage 110 is hardly heated up due to radiation. Therefore, precipitation of a crystal can be reduced without disposing a radiation prevention portion 102. However, the radiation prevention portion 102 may be arranged as shown in FIG. 14 when the further prevention of the precipitation of the crystal or the like is desired.

Here, though an embodiment having a single small hole is shown in the above embodiment, of course, plural holes may be adopted. In addition, the small hole of a diameter of 2 mm or less is preferable. If the device provides a plurality of small holes, it is also possible to make their diameter smaller.

Moreover, in the above-described embodiment, the raw material solution is pulled by the gas when an angle between a carrier flow passage and the material solution introduction is an acute angle (30 degrees). The solution is pushed by the gas when the angle is 90 degrees or more. Therefore, 30 to 90 degrees are preferable. More concretely, the most suitable angle is determined by the solution's viscosity and quantity of flow. When the viscosity or the quantity of the flow is large, the solution smoothly flows by making it a more acute angle. Therefore, the most suitable angle matching to the viscosity and the quantity of the flow should be obtained by an experiment and so on before the practice.

In addition, in the above embodiment, it is preferable to provide a mechanism to control a distance of space between a shower head and a susceptor on an arbitrary distance. Furthermore, it is desirable to provide a liquid mass flow controller to control the quantity of flow of the raw material solution and to provide a degasifying means for degasifying it on the upstream side of the liquid mass flow controller. If the material solution is introduced into the mass flow controller without degasifying, dispersions of the deposited films are caused on the same wafer or between the other wafers. Dispersion of the film thickness will be remarkably reduced by introducing the raw material solution into the mass flow controller after helium is degasified.

It is possible to further prevent the dispersion of the film thickness by providing a means to control the temperature of the material solution, a helium pressure-feed container, the liquid mass flow controller and piping in front and back to be in constant temperature. Moreover, a change in quality of the raw material solution which is chemically unstable can be also prevented. When a thin film of SBT is formed, the deposition is precisely controlled within a range of 5 to 20° C. In particular, the range between 11 to 13° C. is desirable.

Figure 22:
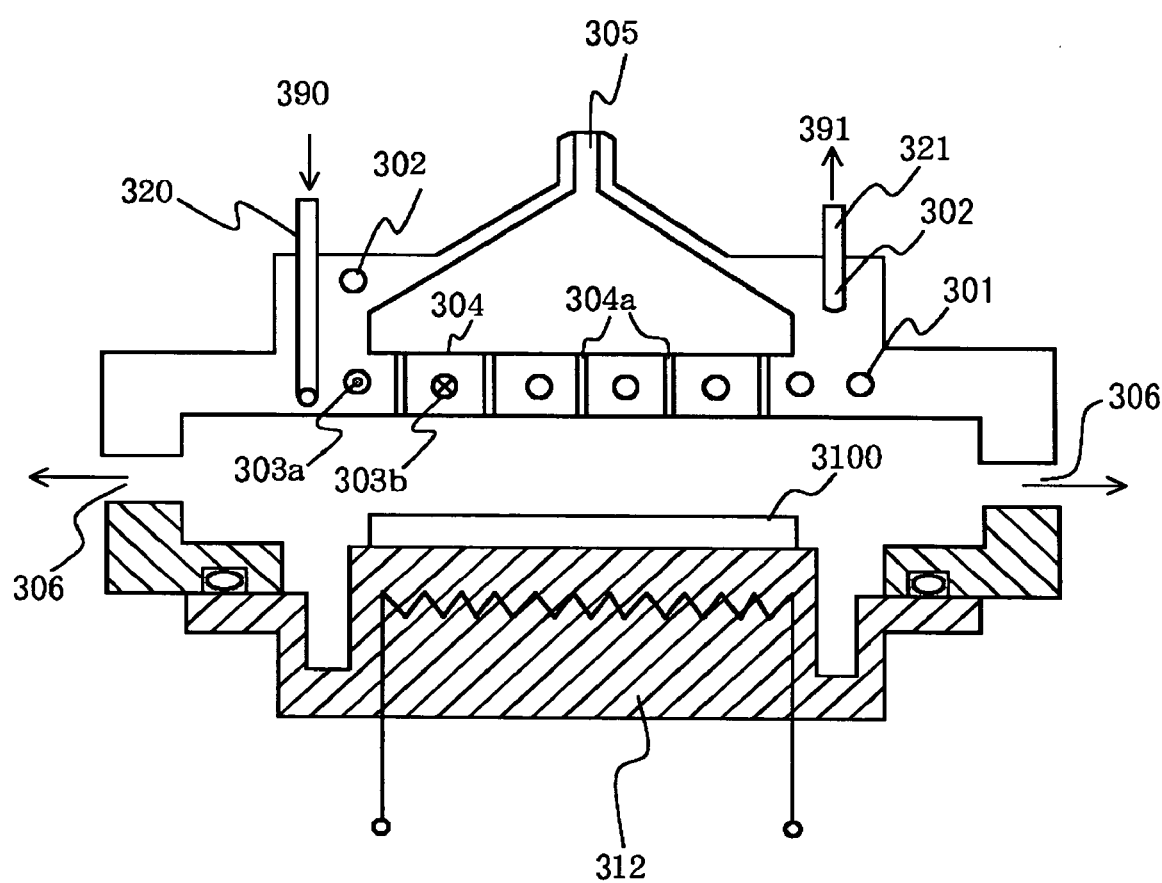
FIG. 22 is a cross section showing a film-forming device.
Figure 23:
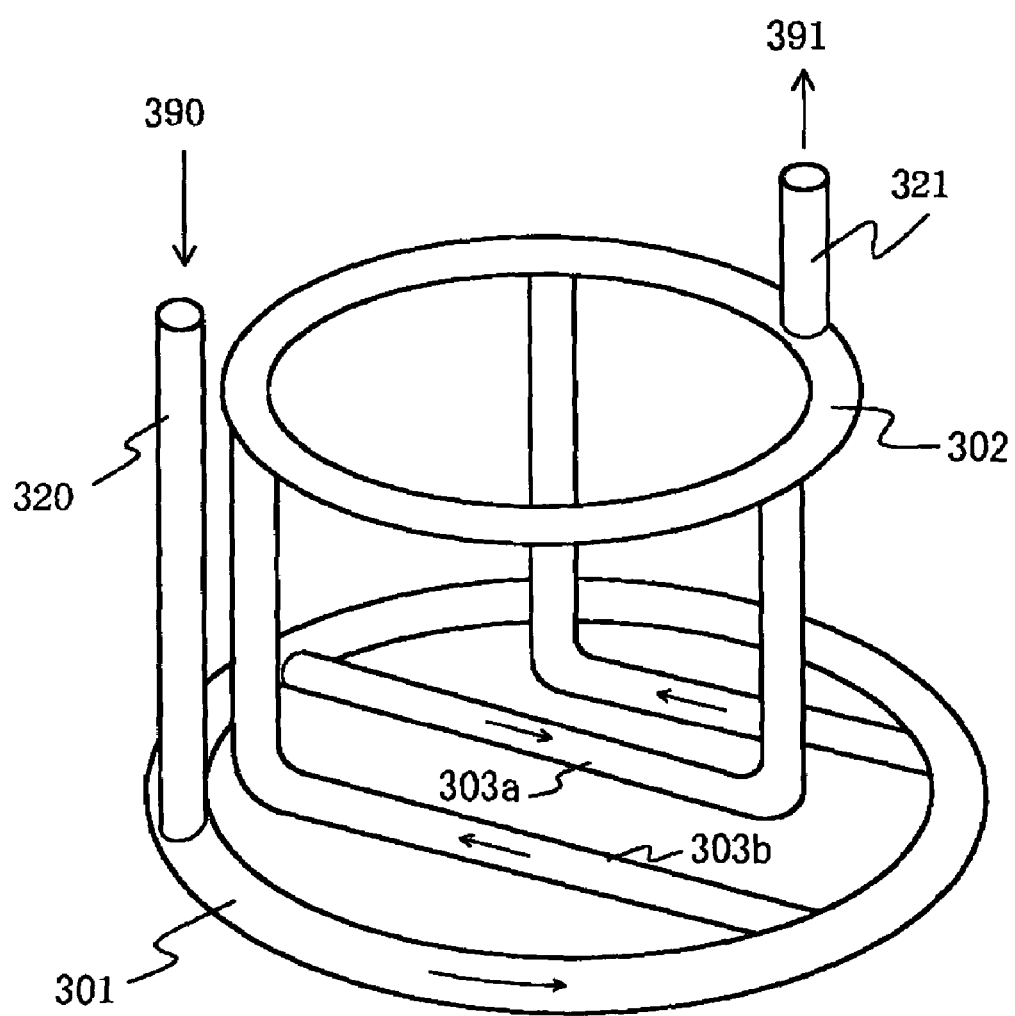
FIG. 23 is an illustration showing constitution of the heat medium circulation that it is scattered in FIG. 22.

In addition, in the substrate surface treatment device in which a predetermined gas is sprayed on the substrate surface of the silicon substrate shown in FIG. 22, 23 to conduct a surface treatment for the substrate surface. Such a device is desirable that has and configures an upstream ring 301 connected to a heat medium entrance 320 for flowing through a heat medium, a downstream ring 302 connected to a heat medium outlet 321 of the predetermined heat medium, and, at least, two heat transmission passages 303*a*, 303*b* which are connected in a parallel direction to between the upstream ring 301 and downstream ring 302 and form a passage for the heat medium, and a flow passage directed from the upstream ring 301 to downstream ring 302 between adjacent the heat transmission passage 303*a*, 303*b* being alternated and a heat medium circulation passage desirable to make the gas to a specified temperature.

Moreover, it is preferable that the substrate surface treatment device is in a prescribed plane in the heat medium circulation passage, has a heat conversion board 304 which is thermally connected to the heat medium circulation passage in a plane formed with the flow passage of the heat medium in the parallel direction, and is able to heat the plane of the heat conversion board 304 to the substantially uniform temperature via the heat medium.

Furthermore, it is preferable that the substrate surface treatment device is in a predetermined plane in the heat medium circulation passage, has the heat conversion board 304 which is thermally connected to the heat medium circulation passage in the plane formed with the flow passage of the heat medium in the parallel direction, and is able to heat the plane of the heat conversion board 304 to the substantially uniform temperature via the heat medium.

In addition, in the plane of the heat conversion board 304, it is preferable that a plurality of intercommunication small holes which pass the predetermined gas to the vertical direction of the plane is formed, and the predetermined gas passing the intercommunication small hole can be heated to a substantially uniform temperature in the plane.

Thus, a direction of the flow passage from the upstream ring to the downstream ring between heat transmission passages adjacent to the heat medium circulation passage can be configured so as to flow in turn. Thus, the difference in temperature of the domain that is next to a heat transmission passage is configured in high/low/high/low. By such a configuration, it is possible to uniformly heat or cool down the heat conversion board. In addition, the configuration also has the heat conversion board which is thermally connected to the heat circulation passage in the plane formed with the flow passage of the heat medium in the parallel direction thereto. Thus, it becomes possible to heat the plane of the heat conversion board in the substantially uniform temperature by the heat medium.

INDUSTRIAL APPLICABILITY

According to the present invention, a deposition device for MOCVD and a vaporizer for other devices which can be used for a long term without clogging and which can stably supply a material to a reaction part can be provided.

According to the present invention, it is possible to obtain vaporizing gas in which the organic metal materials are uniformly dispersed.

What is claimed is:

1. A vaporizer, comprising:
a dispersion part; and
a vaporization part,
the dispersion part having
i) a gas passage formed internally,
ii) a gas inlet configured to introduce a carrier gas into the gas passage,
iii) a means to supply a raw material solution to the gas passage, and
iv) a gas outlet configured to send the carrier gas including the raw material solution to the vaporization part, and
the vaporization part having
i) a heating means configured to heat an inside of the vaporization part, and
ii) a heat prevention member covering the gas outlet having an opening with a cross-sectional area smaller than a cross-sectional area of an opening of the gas outlet,
wherein the cross-sectional area of the opening of the heat prevention member is less than ½ of the cross-sectional area of the opening of the gas outlet.

2. A vaporizer according to claim 1, wherein the cross-sectional area of the opening of the heat prevention member is less than ⅓ of the cross-sectional area of the opening of the gas outlet.

3. A vaporizer according to claim 1, wherein the length of the opening of the heat prevention member is more than 5 times of the diameter of the opening of the heat prevention member.

4. A vaporizer according to claim 1, wherein the length of the opening of the heat prevention member is more than 10 times of the diameter of the opening of the heat prevention member.

5. A vaporizer according to claim 1, further comprising a cooling means configured to cool the heat prevention member.

6. A vaporizer according to claim 1, wherein the heat prevention member is made of one of an inert polymer of tetrafluoroethylene stainless steel, and ceramic.

* * * * *